United States Patent
Lee

(10) Patent No.: US 9,842,658 B2
(45) Date of Patent: Dec. 12, 2017

(54) METHODS OF OPERATING NONVOLATILE MEMORY DEVICES INCLUDING VARIABLE VERIFICATION VOLTAGES BASED ON PROGRAM/ERASE CYCLE INFORMATION

(71) Applicant: Samsung Electronics Co., Ltd., Suwon-si, Gyeonggi-do (KR)

(72) Inventor: Chang-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/132,737

(22) Filed: Apr. 19, 2016

(65) Prior Publication Data

US 2016/0307633 A1   Oct. 20, 2016

(30) Foreign Application Priority Data

Apr. 20, 2015 (KR) .................. 10-2015-0054995

(51) Int. Cl.
| | |
|---|---|
| *G11C 16/34* | (2006.01) |
| *G11C 16/16* | (2006.01) |
| *G11C 16/04* | (2006.01) |
| *G11C 16/10* | (2006.01) |
| *G11C 11/56* | (2006.01) |

(52) U.S. Cl.
CPC ........ *G11C 16/349* (2013.01); *G11C 11/5635* (2013.01); *G11C 16/0483* (2013.01); *G11C 16/10* (2013.01); *G11C 16/16* (2013.01); *G11C 16/3404* (2013.01); *G11C 16/344* (2013.01); *G11C 16/3422* (2013.01); *G11C 16/3436* (2013.01); *G11C 16/3445* (2013.01); *G11C 16/3454* (2013.01); *G11C 16/3459* (2013.01)

(58) Field of Classification Search
CPC ............ G11C 16/3404; G11C 16/3422; G11C 16/3436; G11C 16/344; G11C 16/3445; G11C 16/3454; G11C 16/3459; G11C 16/349

See application file for complete search history.

(56) References Cited

U.S. PATENT DOCUMENTS

| | | | |
|---|---|---|---|
| 7,397,704 B2 | 7/2008 | Sim | |
| 7,495,966 B2* | 2/2009 | Aritome | G11C 11/5628 365/185.24 |
| 7,692,970 B2* | 4/2010 | Park | G11C 16/3454 365/185.19 |
| 7,715,239 B2* | 5/2010 | Aritome | G11C 11/5628 365/185.18 |
| 7,916,543 B2* | 3/2011 | Goda | G11C 16/3468 365/185.17 |

(Continued)

FOREIGN PATENT DOCUMENTS

| | | |
|---|---|---|
| KR | 2008-0021684 A | 3/2008 |
| KR | 10-2008-0046482 A | 5/2008 |

(Continued)

*Primary Examiner* — Vanthu Nguyen
(74) *Attorney, Agent, or Firm* — Myers Bigel, P.A.

(57) ABSTRACT

Methods of operating a nonvolatile memory device include performing erase loops on a memory block using a first voltage, performing program loops on memory cells of the memory block using a second voltage, and increasing the first and second voltages based on program/erase cycle information for the memory cells. The first voltage may include an erase verification voltage and the second voltage may include a program voltage.

7 Claims, 24 Drawing Sheets

(56) References Cited

U.S. PATENT DOCUMENTS

| | | |
|---|---|---|
| 8,374,036 B2* | 2/2013 | Jeong .................... G11C 16/10 |
| | | 365/185.19 |
| 8,665,645 B2 | 3/2014 | Avraham et al. |
| 9,001,576 B2* | 4/2015 | Hong ................ G11C 16/3427 |
| | | 365/185.02 |
| 9,330,767 B1* | 5/2016 | Steiner ............... G06F 12/0246 |
| 9,396,807 B2* | 7/2016 | Alhussien .......... G11C 16/3431 |
| 9,418,000 B2* | 8/2016 | Raghunathan ....... G11C 29/021 |
| 2006/0282610 A1 | 12/2006 | Dariel et al. |
| 2008/0117688 A1 | 5/2008 | Park et al. |
| 2011/0044113 A1* | 2/2011 | Kim .................... G11C 11/5628 |
| | | 365/185.19 |
| 2013/0148430 A1* | 6/2013 | Shiino .................... G11C 16/10 |
| | | 365/185.18 |
| 2014/0082460 A1 | 3/2014 | Pangal et al. |
| 2014/0185381 A1 | 7/2014 | Lee |

FOREIGN PATENT DOCUMENTS

| KR | 10-2008-0090801 A | 10/2008 |
|---|---|---|
| KR | 10-2010-0010673 A | 2/2010 |
| KR | 10-2010-0064005 A | 6/2010 |
| KR | 10-2013-0091075 A | 8/2013 |

\* cited by examiner

METHODS OF OPERATING NONVOLATILE MEMORY DEVICES INCLUDING VARIABLE VERIFICATION VOLTAGES BASED ON PROGRAM/ERASE CYCLE INFORMATION

CROSS-REFERENCE TO RELATED APPLICATION

This U.S. Non-provisional application claims priority under 35 USC §119 to Korean Patent Application No. 10-2015-0054995, filed on Apr. 20, 2015, in the Korean Intellectual Property Office (KIPO), the disclosure of which is incorporated by reference in its entirety herein.

BACKGROUND

1. Technical Field

Some example embodiments relate generally to semiconductor integrated circuits, and more particularly, to nonvolatile memory devices and methods of operating nonvolatile memory devices.

2. Discussion of the Related Art

Semiconductor memory devices may be classified into volatile semiconductor memory devices and nonvolatile semiconductor memory devices. Volatile semiconductor memory devices may perform read and write operations at high speed, while contents stored therein may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

Nonvolatile semiconductor memory devices may include a mask read-only memory (MROM), a programmable ROM (PROM), an erasable programmable ROM (EPROM), an electrically erasable programmable ROM (EEPROM), etc.

Flash memory is a commonly used type of nonvolatile memory device. Flash memory may be widely used for voice and image storing media in electronic devices, such as computers, cellular phones, personal digital assistants (PDAs), digital cameras, camcorders, voice recorders, MP3 players, handheld PCs, game machines, facsimile machines, scanners, and printers.

As the demand for high integration memory devices has increased, multi-bit memory devices having memory cells capable of storing multi-bit data have become more common.

SUMMARY

Some example embodiments are directed to provide a method of operating a nonvolatile memory device, capable of enhancing performance.

Some example embodiments are directed to provide a nonvolatile memory device that performs the method.

In some embodiments, methods of operating a nonvolatile memory device include performing erase loops on a memory block using a first voltage, performing program loops on memory cells of the memory block using a second voltage, and increasing the first and second voltages based on program/erase cycle information for the memory cells.

Each of the program loops may include performing an erase operation on the memory block by applying an erase voltage to the memory block and performing an erase verification operation on the memory block by applying an erase verification voltage to the memory block. The first voltage may include the erase verification voltage. The program/erase cycle information may include a number of program/erase cycles performed on the memory cells. The erase verification voltage may be increased as the number of program/erase cycles increases.

In some embodiments, the erase verification operation may include simultaneously applying the erase verification voltage to word-lines of the memory block. In some embodiments, the erase verification operation may include sequentially applying the erase verification voltage to word-lines of the memory block.

In some embodiments, each of the program loops may include programming respective ones of memory cells connected to a word-line to an erased state or a plurality of programmed states by applying a program voltage to the word-line and performing a program verification on the memory cells by applying a program verification voltage to the word-line. The second voltage may include the program voltage and the program verification voltage. The program voltage and the program verification voltage may be increased as the number of the program/erase cycle increases such that a gap between a first threshold voltage distribution of the erased state and a second threshold voltage distribution of one of the programmed states is maintained.

In further embodiments, methods may include performing an erase loop on a memory block in response to an erase command, performing a program loop on first memory cells of the memory block connected to a first word-line, increasing a first voltage of the erase loop based on program/erase cycle information for the first memory cells, and changing a second voltage of a second word-line adjacent the first word-line during a memory operation on the first memory cells.

In some embodiments, performing the program loop may include performing an erase operation on the memory block by applying an erase voltage to the memory block and performing an erase verification operation on the memory block by applying an erase verification voltage to the memory block. The first voltage may include the erase verification voltage. The program/erase cycle information may include a number of program/erase cycles performed on the memory cells.

In some embodiment, increasing the level of the first voltage may include increasing the erase verification voltage as the number of the program/erase cycles increases. Changing the second voltage may include increasing a program pass voltage applied to the second word-line from a first level to a second level during the program verification operation on the first memory cells. The level of the program pass voltage may be increased in response to the number of the program/erase cycles exceeding a reference value.

In further embodiments, increasing the first voltage may include increasing the erase verification voltage as the number of the program/erase cycles on the first memory cells increases. Changing the second voltage may include increasing a program pass voltage applied to the second word-line from a first level to a second level during the program verification operation on the first memory cells and adjusting a read pass voltage applied to the second word-line to a third level different from the second level during a read operation on the memory cells. The third level may be less than the second level.

According to still further embodiments, methods include performing erase loops on a memory block using an erase verification voltage, performing program loops on memory cells of the memory block using a program voltage, changing the erase verification voltage used in the erase loops as a number of program/erase cycles increases, and changing the program voltage used in the program loops to maintain a gap between a threshold voltage of an erased state and a threshold voltage of a programmed state.

Changing the erase verification voltage used in the erase loops as a number of program/erase cycles increases may include increasing the erase verification voltage as the number of program/erase cycles increases. Changing the program voltage used in the program loops to maintain a gap between a threshold voltage of an erased state and a threshold voltage of a programmed state may include increasing the program voltage as the erase verification voltage increases.

In some embodiments, each of the program loops may include programming respective ones of memory cells connected to a word-line to an erased state or a plurality of programmed states by applying a program voltage to the word-line and performing a program verification on the memory cells by applying a program verification voltage to the word-line. The methods may further include increasing the program verification voltage when the program voltage increases. The program voltage and the program verification voltage may be increased as the number of the program/erase cycle increases such that a gap between a first threshold voltage distribution of the erased state and a second threshold voltage distribution of the programmed state is maintained. The methods may further include changing a pass voltage applied to a non-selected word-line as the program voltage changes.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
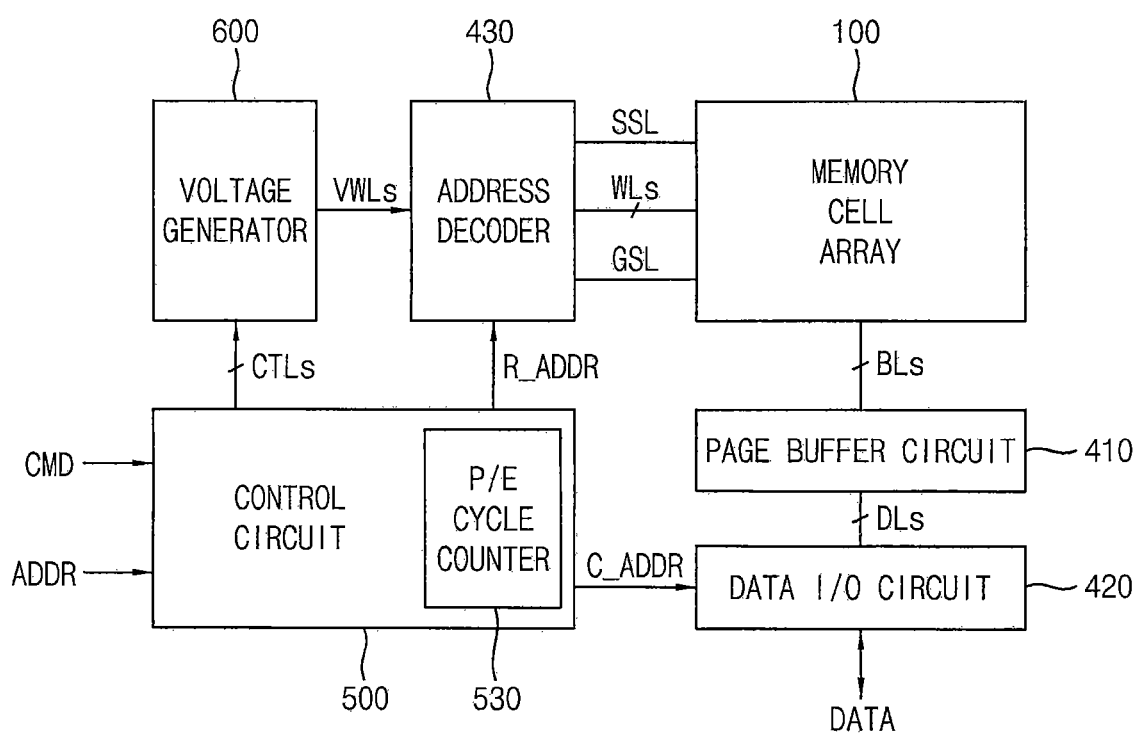
FIG. 1 is a block diagram illustrating a nonvolatile memory device according to some example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a nonvolatile memory device according to some example embodiments.

Referring to FIG. 1, the nonvolatile memory device 10 includes a memory cell array 100, an address decoder 430, a page buffer circuit 410, a data input/output circuit 420, a control circuit 500 and a voltage generator 600.

The memory cell array 100 may be coupled to the address decoder 430 through a string selection line SSL, a plurality of word-lines WLs, and a ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

In some example embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In some example embodiments, the memory cell array 100 may be a two-dimensional memory cell array, which is formed on a substrate in a two-dimensional structure (or a horizontal structure).

Figure 2:
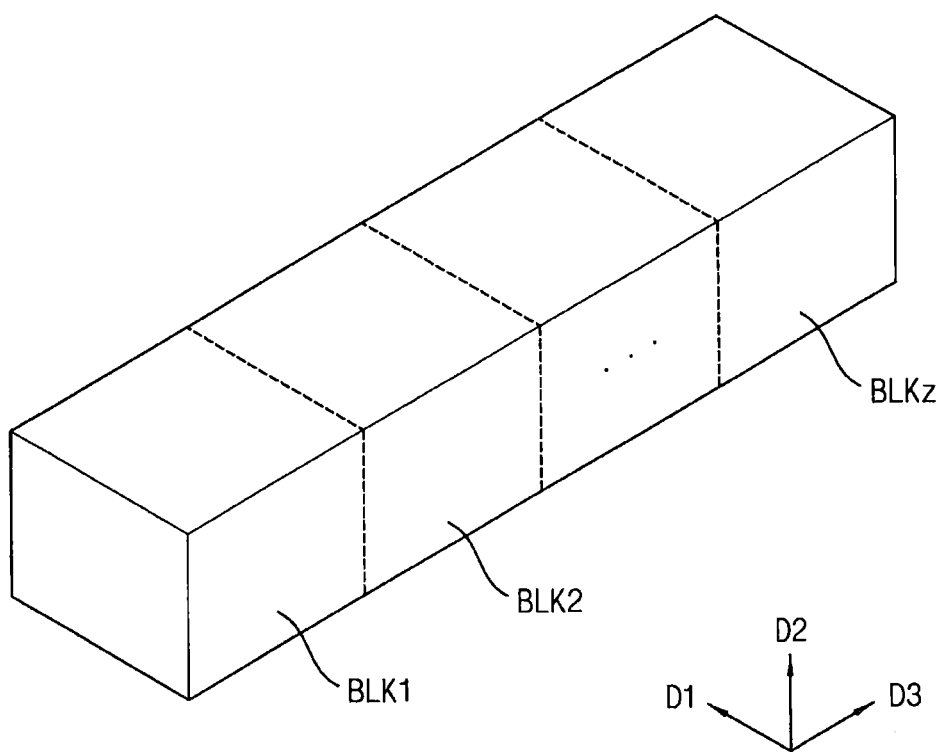
FIG. 2 is a block diagram illustrating the memory cell array in FIG. 1.

FIG. 2 is a block diagram illustrating the memory cell array in FIG. 1.

Referring to FIG. 2, the memory cell array 110a may include a plurality of memory blocks BLK1 to BLKz. In some embodiments, the memory blocks BLK1 to BLKz are selected by the address decoder 430 in FIG. 1. For example, the address decoder 430 may select a memory block BLK corresponding to a block address among the memory blocks BLK1 to BLKz.

Figure 3:
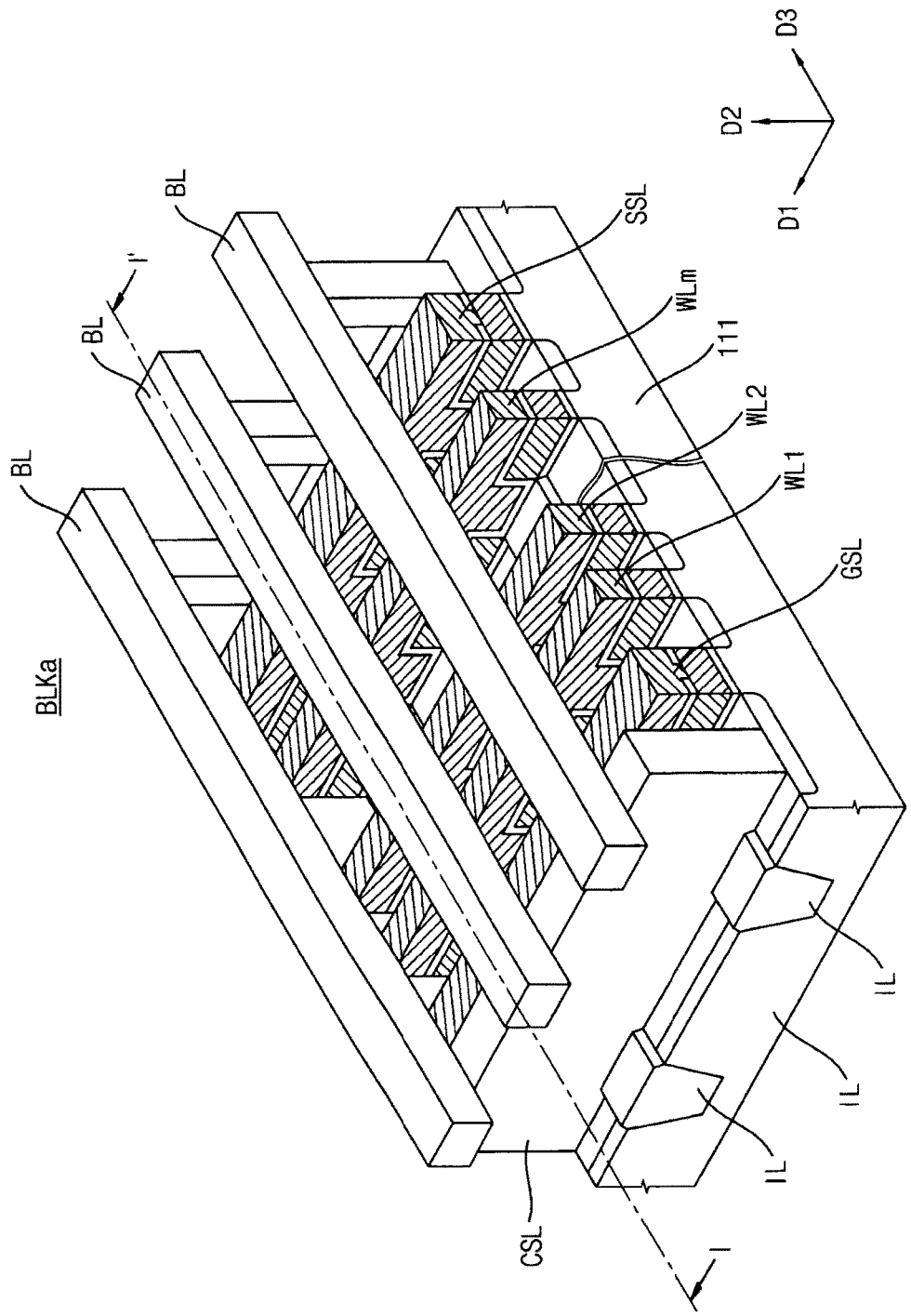
FIG. 3 is a perspective view illustrating one of the memory blocks of FIG. 2.
Figure 4:
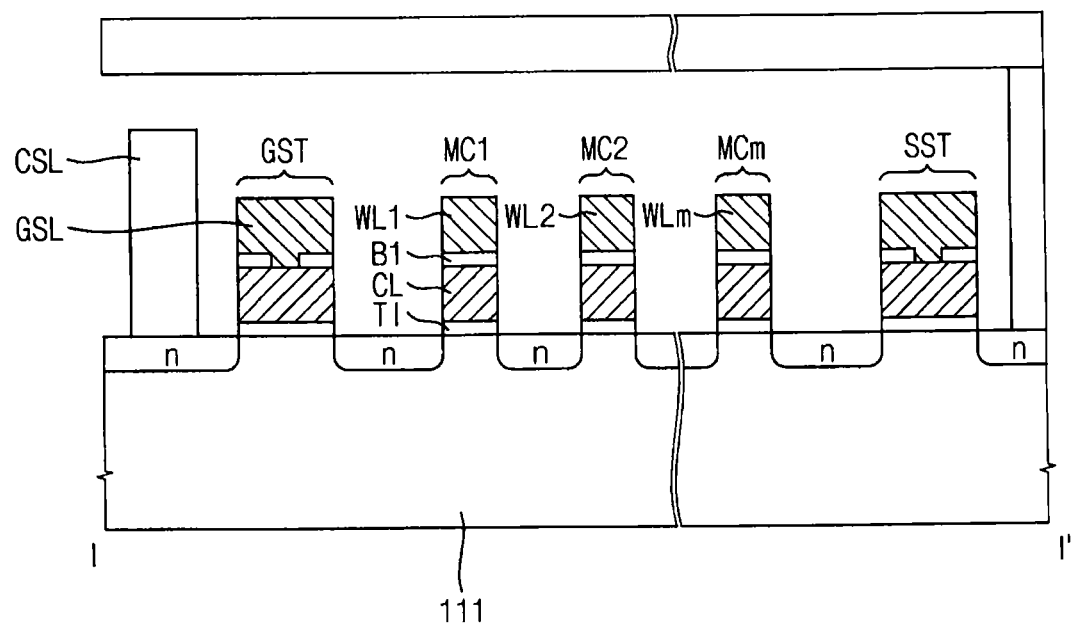
FIG. 4 is a sectional view taken along the line I-I' of the memory block of FIG. 3.

FIG. 3 is a perspective view illustrating one of the memory blocks of FIG. 2. FIG. 4 is a sectional view taken along the line I-I' of the memory block of FIG. 3.

Referring to FIGS. 3 and 4, a substrate 111 of the memory block BLKa is provided. For example, the substrate 111 is a well having a p-conductive type.

A device isolation layer IL is provided on the substrate 111 to define an active region. The illustrated example includes three active regions that extend along a third direction and are spaced along a first direction by a specific distance are defined. However, the number of active regions is not limited thereto.

A tunnel insulation layer TI is provided on each active region. In each active region, the tunnel insulation layers TI are spaced along the third direction by a specific distance. For example, each tunnel insulation layer TI may include a thermal oxide layer. For example, each tunnel insulation layer TI may include an oxide layer.

In each active region, charge storage layers CL are provided on the tunnel insulation layers TI. For example, the charge storage layers CL may include a conductive material such as polysilicon. For example, each charge storage layer CL may include a nitride layer or a metal oxide layer (e.g., an aluminum oxide layer, or a hafnium oxide layer).

If the charge storage layers CL include a conductive material such as polysilicon, the charge storage layers may operate as floating gates. The charge storage layers CL store data by accumulating charges. If the charge storage layers CL include an insulation material, the charge storage layers operate as charge trapping layers. The charge storage layers CL store data by trapping charges.

The tunnel insulation layers TI and charge storage layers CL are provided along a first direction D1 on a plurality of active regions. On an axial line where the tunnel insulation layers TI and the charge storage layers CL are provided along the first direction D1, block insulation layers BI are provided along the first direction D1. Each block insulation layer BI may include a nitride layer. Each blocking insulation layer BI may include a high dielectric layer (e.g., an aluminum oxide layer, or a hafnium oxide layer) having a higher dielectric constant than that of the tunneling insulation layers TI.

A polysilicon layer is provided on the tunnel insulation layers TI. The polysilicon layer extends along the first direction D1 on a plurality of active regions. The polysilicon layer is spaced along a third direction D3 by a specific distance.

Each of the tunneling insulation layer TI, the charge storage layer CL, the blocking insulation layer BI, and the polysilicon layer constitutes a gate structure. In some embodiments, each of the tunneling insulation layer TI, the charge storage layer CL, the blocking insulation layer BI, and the polysilicon layer may constitute a memory cell MC. In some embodiments, in a specific gate structure, perforations may be formed in the blocking insulation layer BI such that the polysilicon layer and the charge storage layer CL may be connected. This gate structure may form a selection transistor SST or GST.

If the charge storage layer CL includes an insulation material, perforations may not be provided at a blocking insulation layer BI of a gate structure. A charge storage layer CL and a control polysilicon layer of a gate structure of a selection transistor SST or GST may not be separated by a blocking insulation layer BI.

In some embodiments, a polysilicon layer forming a gate structure of a memory cell may extend along the first direction to form a word-line WL. In some embodiments, the polysilicon layer forming a gate structure of the selection transistor SST or GST extend along the first direction to form a selection line SSL or GSL.

Junction regions having an n conductive type are formed between gate structures. At this point, a source and a drain of a selection transistor SST or GST can be formed simultaneously. A conductive material extending along the first direction is provided on a source of a ground selection transistor GST. This conductive material forms a common source line CSL. The common source line CSL may include, for example, polysilicon. The common source line CSL may include, for example, metal.

A bit-line contact BP connected to a bit-line BL is provided on a drain of the string selection transistor SST. A drain of the string selection transistor SST is connected to a corresponding bit-line BL through the bit-line contact BP. Bit lines are provided on the same axial line as the active regions. For example, three bit-lines are shown.

Figure 5:
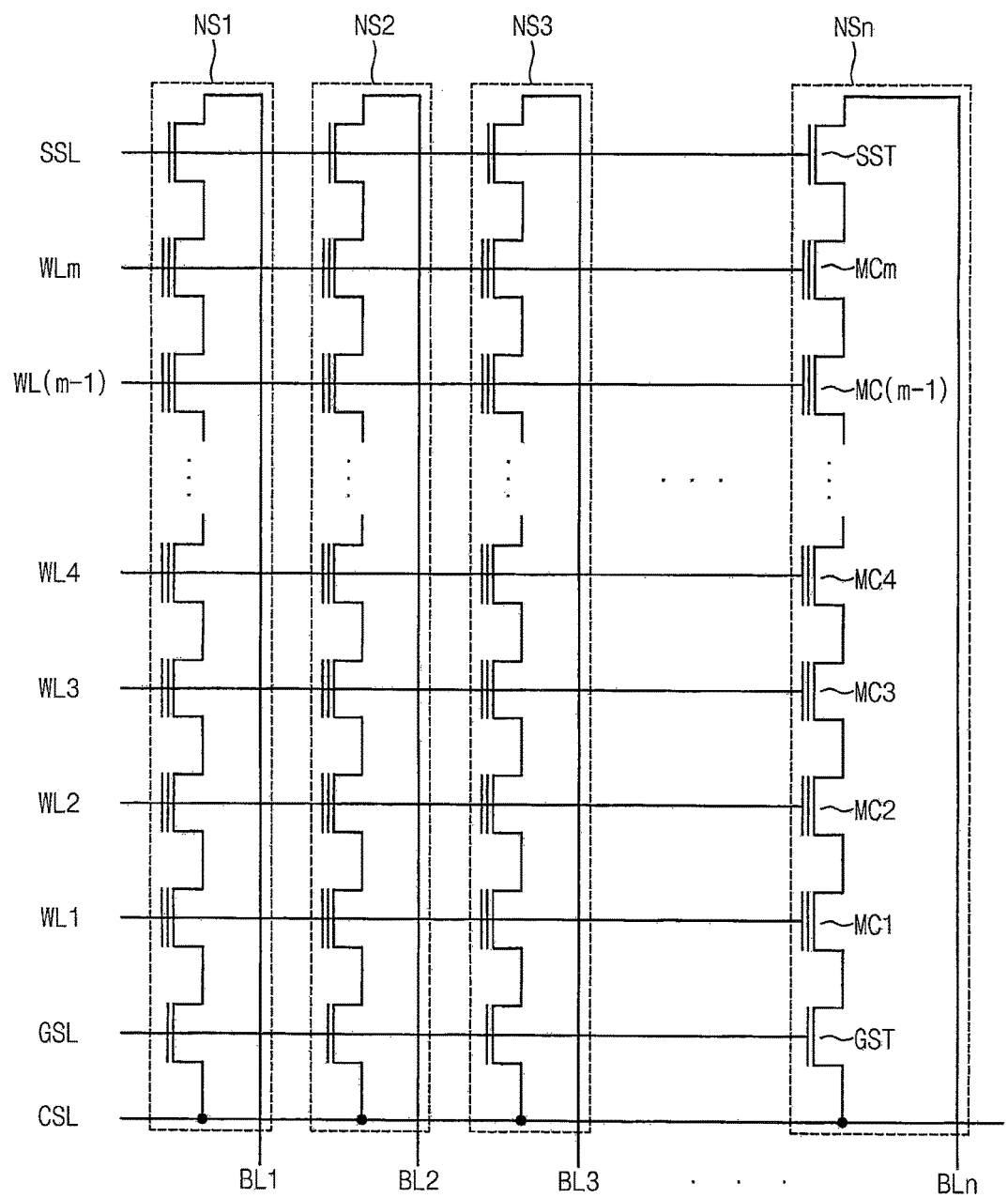
FIG. 5 is a circuit diagram illustrating an equivalent circuit of the memory block described with reference to FIGS. 3 and 4.

FIG. 5 is a circuit diagram illustrating an equivalent circuit of the memory block described with reference to FIGS. 3 and 4.

The memory block BLKa of FIG. 5 may be formed on a substrate in a two-dimensional structure (or a horizontal structure). For example, a plurality of memory cell strings included in the memory block BLKa may be formed in a direction parallel to the substrate.

Referring to FIG. 5, the memory block BLKa may include memory cell strings NS1 to NSm.

Each of the memory cell strings NS1 to NSm may include a string selection transistor SST, a plurality of memory cells MC, and a ground selection transistor GST that are serially connected.

The string selection transistors SST included in the memory cell strings NS1 to NSm may be commonly connected to the string selection line SSL. Memory cells arranged in a same row among memory cells MC included in the memory cell strings NS1 to NSm may be commonly connected to corresponding word-lines WL1 to WLn. The ground selection transistors GST included in the memory cell strings NS1 to NSm may be commonly connected to the ground selection line GSL.

The ground selection transistors GST included in the memory cell strings NS1 to NSm may be commonly connected to the common source line CSL. The string selection transistor SST included in the memory cell strings NS1 to NSm may be connected to corresponding bit-lines BL1 to BLm. Here, n and m represent positive integers.

Figure 6:
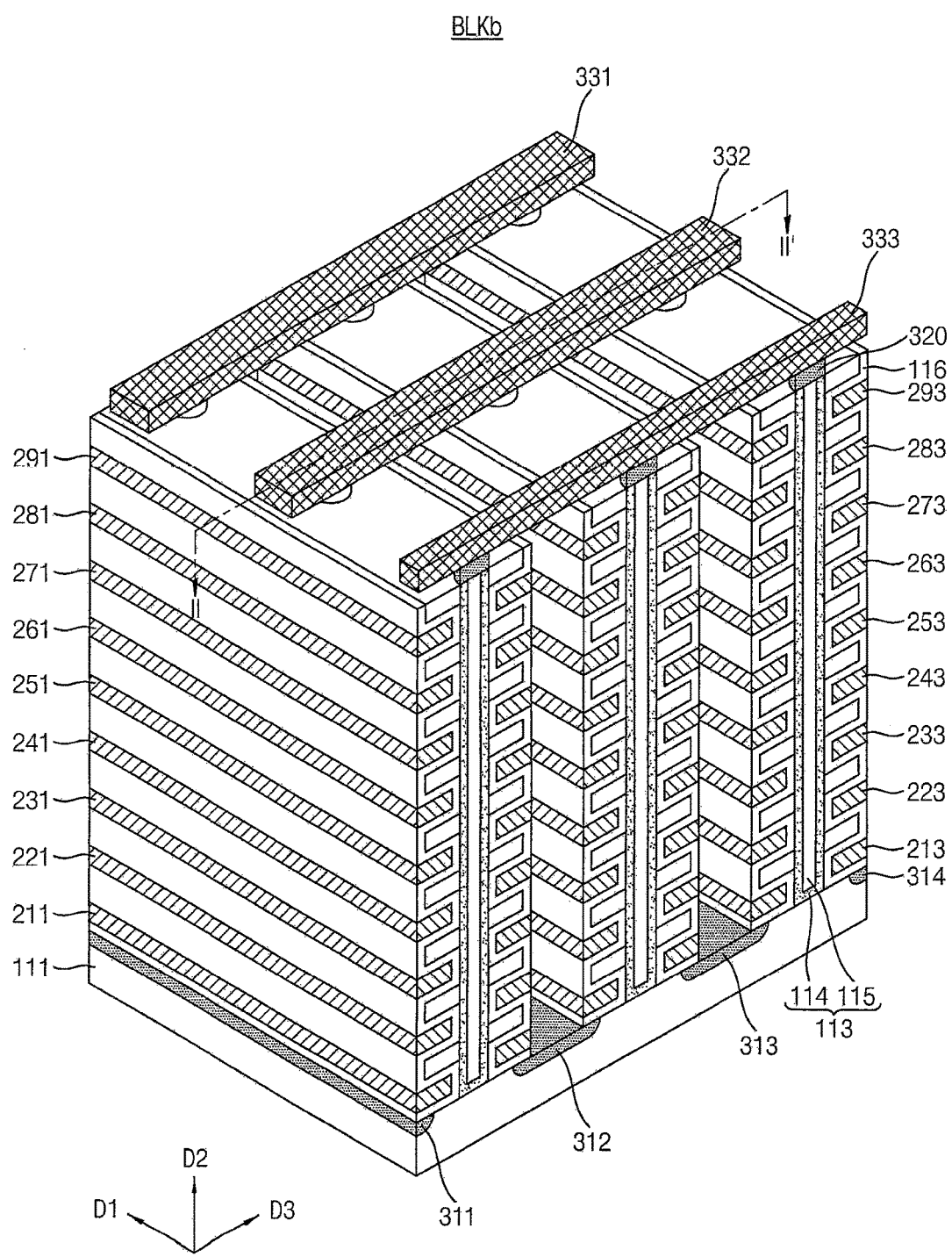
FIG. 6 is a perspective view illustrating one of memory blocks of FIG. 2.
Figure 7:
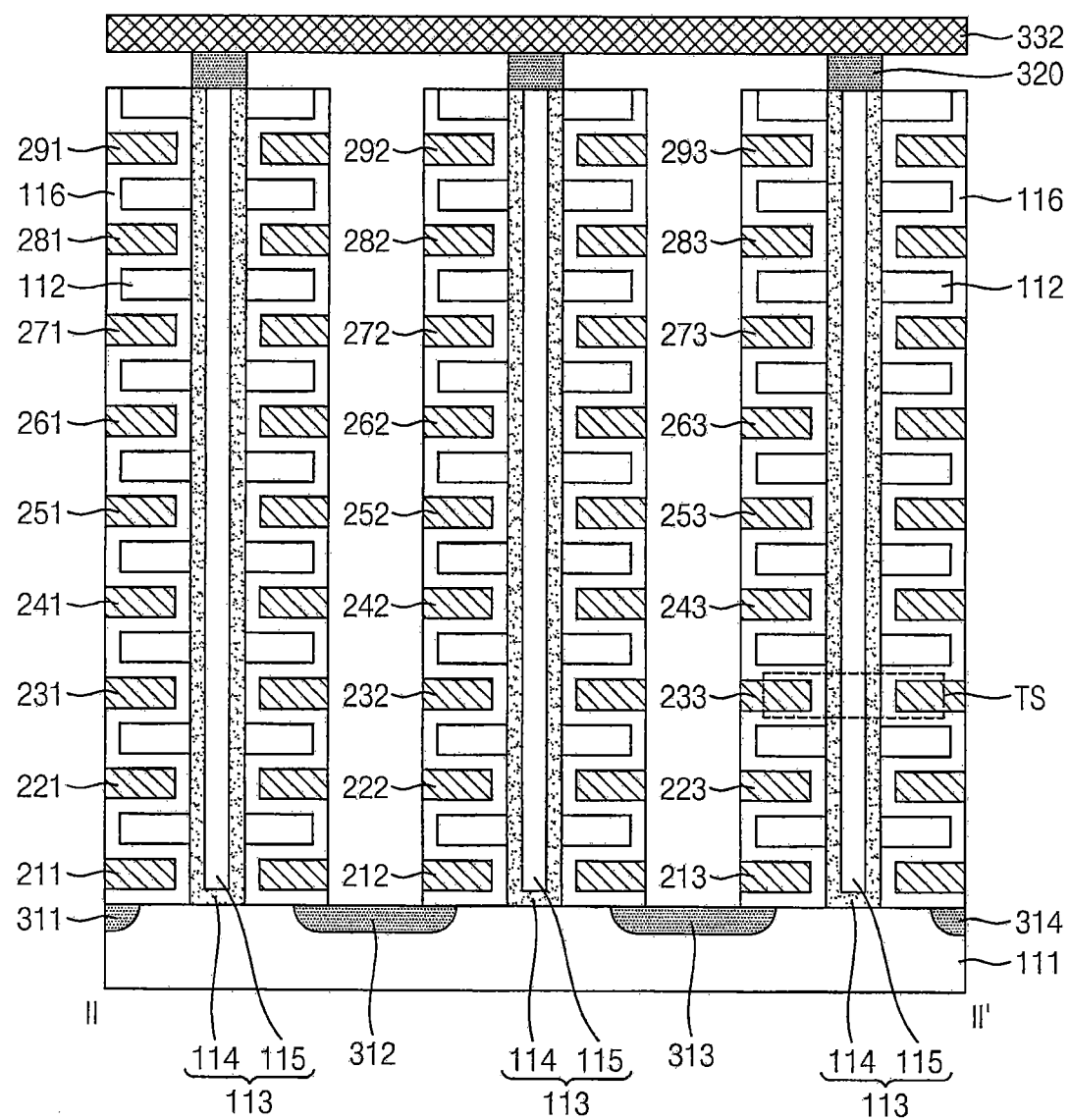
FIG. 7 is a sectional view taken along the line II-II' of the memory block of FIG. 6.

FIG. 6 is a perspective view illustrating one BLKb of memory blocks of FIG. 2. FIG. 7 is a sectional view taken along the line II-II' of the memory block of FIG. 6.

Referring to FIGS. 6 and 7, the memory block BLKb includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In some embodiments, the substrate 111 has a p-type well (or a p-type packet well). However, the conductive type of the substrate 111 is not limited to the p-type.

A plurality of doping regions 311 to 314 extending along the first direction D1 are provided on the substrate 111. For example, the plurality of doping regions 311 to 314 may have a second type (e.g., a second conductive type) different from the first type of the substrate 111. In some embodiments, the first to fourth doping regions 311 to 314 have an n-type. However, the conductive type of the first to fourth doping regions 311 to 314 is not limited to the n-type.

A plurality of insulation regions 112 extending along the first direction D1 are spaced along the second direction on a region of the substrate 111 between the first and second doping regions 311 and 312. For example, the plurality of insulation regions are spaced along the second direction D2. For example, the insulation regions 112 may include an insulation material such as an oxide layer.

A plurality of pillars 113 penetrating the insulation regions along the second direction D2 are sequentially disposed along the first direction on a region of the substrate 111 between the first and second doping regions 311 and 312. For example, the plurality of pillars 113 penetrate the insulation regions 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In some embodiments, the channel layer 114 of each pillar 113 includes a p-type silicon. However, the channel layer 114 of each pillar 113 is not limited to p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation regions 112, the pillars 113, and the substrate 111, on a region between the first and second doping regions 311 and 312. For example, the insulation layer 116 provided on the exposed surface in the second direction D2 of the last insulation material 112 may be removed.

For example, the thickness of the insulation layer 116 may be less than the half of the distance between the insulation regions 112. A region where a material besides the insulation regions 112 and the insulation layer 116 may be disposed is provided between the insulation layer 116 provided on the bottom of a first insulation material among the insulation regions 112 and the insulation layer 116 provided on the top of a second insulation material 116 at the bottom of the first insulation material. First conductive materials 211 to 291 are provided on the exposed surface of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation regions 112 and the insulation layer at the bottom of the insulation material disposed on the top of the specific insulation material. A plurality of first conductive materials 221 to 281 extending along the first direction D1 are provided between the insulation regions 112 and it may be understood that the insulation layer 116 is provided between the insulation regions 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, a plurality of insulation regions 112 extend along the first direction D1, a plurality of pillars 113 is disposed sequentially along the first direction D1 and penetrating the plurality of insulation regions 112 along the third direction D3, an insulation layer 116 is provided on the exposed surfaces of the plurality of insulation regions 112 and the plurality of pillars 113, and a plurality of conductive materials 212 to 292 extend along the first direction.

In a region between the third and fourth doping regions 313 and 314, the same structures as those on the first and second doping regions 311 and 312 may be provided. In the region between the third and fourth doping regions 313 and 314, a plurality of insulation regions 112 extend along the first direction D1, a plurality of pillars 113 are disposed sequentially along the first direction and penetrating the plurality of insulation regions 112 along the third direction D3, an insulation layer 116 is provided on the exposed surfaces of the plurality of insulation regions 112 and the plurality of pillars 113, and a plurality of first conductive materials 213 to 293 extend along the first direction D1.

Drains 320 are provided on respective ones of the pillars 113. The drains 320 may include silicon materials doped with a second type. For example, the drains 320 may include silicon materials doped with an n-type. In some embodiments, the drains 320 include n-type silicon materials. However, the drains 320 are not limited to n-type silicon materials.

The width of each drain 320 may be greater than that of the pillar 113. For example, each drain 320 may be provided in a pad form on the top of the corresponding pillar 113. Each drain 320 may extend to a portion of the channel layer 114 of the corresponding pillar 113.

On the drains, the second conductive materials 331 to 333 extending along the third direction D3 are provided. The second conductive materials 331 to 333 are disposed along the first direction D1, being spaced by a specific distance. The second conductive materials 331 to 333 are respectively connected to the drains 320 in a corresponding region. The drains 320 and the second conductive material 333 extending along the third direction D3 may be connected through each contact plug. The second conductive materials 331 to 333 may include metal materials. The second conductive materials 331 to 333 may include conductive materials such as a polysilicon.

Hereinafter, the heights of the first conductive materials 211 to 291, 212 to 292, and 213 to 293 are defined. It is defined that the first conductive materials 211 to 291, 212 to 292, and 213 to 293 sequentially have the first to ninth heights from the substrate 111. The first conductive materials 211 to 213 adjacent to the substrate 111 have the first height. The first conductive materials 291 to 293 adjacent to the second conductive materials 331 to 333 have the ninth height. As an order from the substrate 111 of a specific conductive material among the first conductive materials 211 to 291, 212 to 292, and 213 to 293 is increased, the height of the first conductive material is increased.

Referring to FIGS. 6 and 7, the pillars 113, the insulation layer 116, and the plurality of first conductive materials 211 to 291, 212 to 292, and 213 to 293 form a string. For example, each pillar 113, an adjacent region of the insulation layer 116, and an adjacent region of the first conductive materials 211 to 291, 212 to 292, and 213 to 293 form a NAND string NS. The NAND string NS includes a plurality of transistor structures TS.

Figure 8:
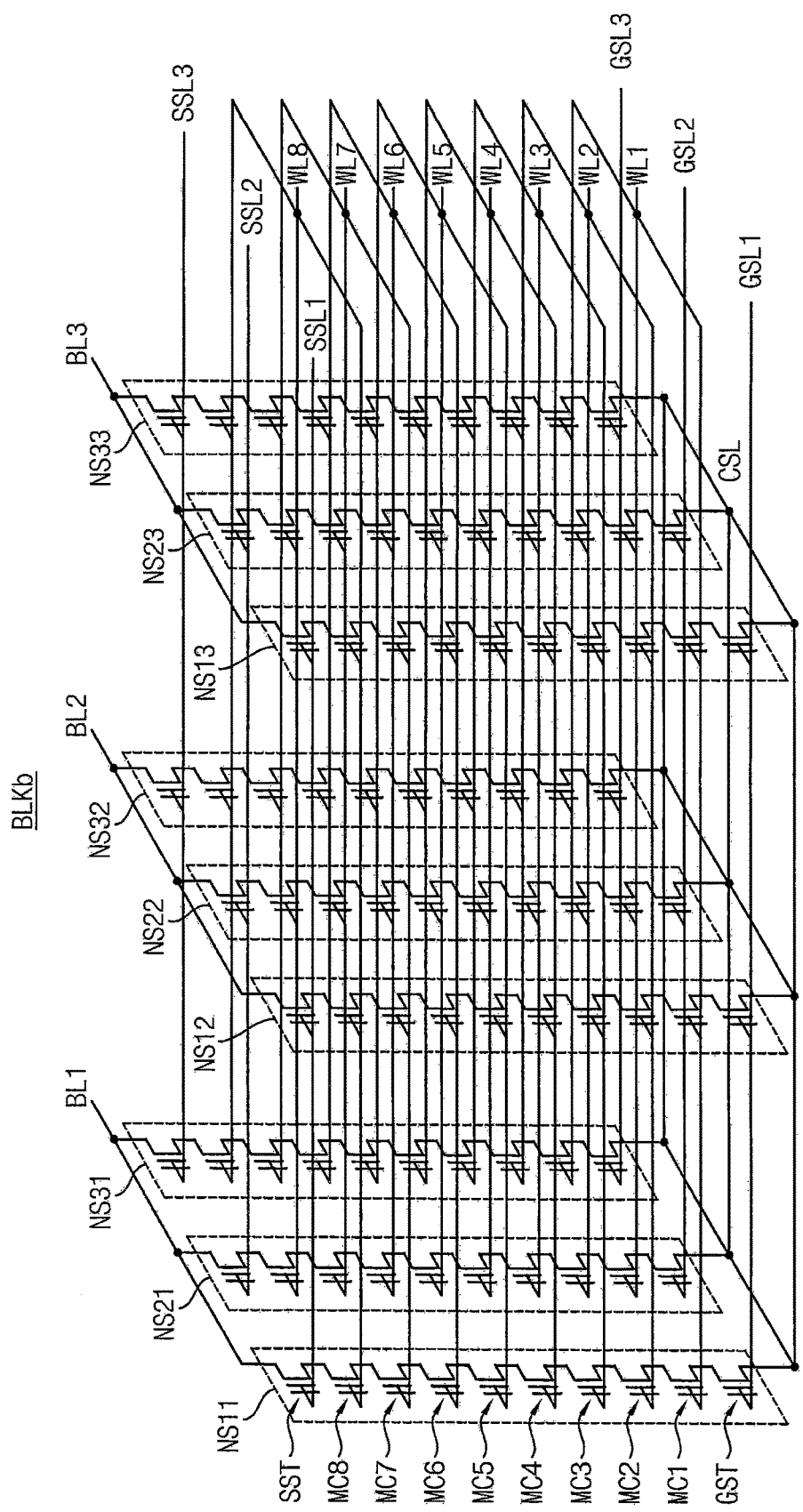
FIG. 8 is a circuit diagram illustrating an equivalent circuit of the memory block of FIGS. 6 and 7.

FIG. 8 is a circuit diagram illustrating an equivalent circuit of the memory block described with reference to FIGS. 6 and 7.

The memory block BLKb of FIG. 8 may be formed on a substrate in a three-dimensional structure (or a vertical structure). For example, a plurality of memory cell strings included in the memory block BLKb may be formed in a direction perpendicular to the substrate.

Referring to FIG. 8, the memory block BLKb may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 8, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 8, the memory block BLKb is illustrated to be coupled to eight word-lines WL1 to WL8 and three bit-lines BL1 to BL3. However, example embodiments are not limited thereto. In some example embodiments, the memory cell array 100a may be coupled to any number of word-lines and bit-lines.

Referring again to FIG. 1, the control circuit 500 may receive a command signal CMD and an address signal ADDR from an external device (e.g., a memory controller), and control an erase loop, a program loop and a read operation of the nonvolatile memory device 10 based on the command signal CMD and the address signal ADDR. The program loop may include a program operation and a program verification operation. The erase loop may include an erase operation and an erase verification operation.

For example, the control circuit 500 may generate control signals CTLs, which are used for controlling the voltage generator 600, based on the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420.

In addition, the control circuit 500 may include a program/erase cycle counter 530 and may generate the control signals CTLs based on program/erase cycle information associated with selected memory cells. The program/erase cycle information associated with selected memory cells may be a number of the program/erase cycle associated with the selected memory cells.

The address decoder 430 may be coupled to the memory cell array 100 through the string selection line SSL, the plurality of word-lines WLs, and the ground selection line GSL. During the program operation or the read operation, the address decoder 200 may determine one of the plurality of word-lines WLs as a first word-line (i.e., a selected word-line) and determine rest of the plurality of word-lines WLs except for the first word-line as unselected word-lines UNSEL_WL based on the row address R_ADDR.

The voltage generator 600 may generate word-line voltages VWLs, which are required for the operation of the nonvolatile memory device 10, based on the control signals CTLs. The word-line voltages VWLs may be applied to the plurality of word-lines WLs through the address decoder 430.

For example, during an erase operation, the voltage generator 600 may apply an erase voltage to a well of the memory block and may apply a ground voltage to entire word-lines of the memory block. During an erase verification operation, the voltage generator 600 may apply an erase verification voltage to the entire word-lines of the memory block or sequentially apply the erase verification voltage to word-lines in a word-line basis.

For example, during a program operation, the voltage generator 600 may apply a program voltage to the first word-line and may apply a program pass voltage to the unselected word-lines. In addition, during a program verification operation, the voltage generator 600 may apply a program verification voltage to the first word-line and may apply a verification pass voltage to the unselected word-lines.

The page buffer circuit 410 may be coupled to the memory cell array 100 through the plurality of bit-lines BLs. The page buffer circuit 410 may include a plurality of page buffers. In some example embodiments, one page buffer may be connected to one bit-line. In some example embodiments, one page buffer may be connected to two or more bit-lines.

The page buffer circuit 410 may temporarily store data to be programmed in a selected page or data read out from the selected page.

The data input/output circuit 420 may be coupled to the page buffer circuit 410 through data lines DL. During a program operation, the data input/output circuit 410 may receive program data DATA from an external device (e.g., a memory controller) and provide the program data DATA to the page buffer circuit 410 based on the column address C_ADDR received from the control circuit 500. During a read operation, the data input/output circuit 420 may provide read data DATA, which are stored in the page buffer circuit 410, to the external device based on the column address C_ADDR received from the control circuit 500.

In addition, the page buffer circuit 410 and the data input/output circuit 420 read data from a first area of the memory cell array 100 and write the read data to a second area of the memory cell array 100. The page buffer circuit 410 and the data input/output circuit 420 may perform a copy-back operation.

For example, during a read operation, the voltage generator 600 may apply a read voltage to the first word-line and may apply a read pass voltage to the unselected word-lines.

Figure 9:
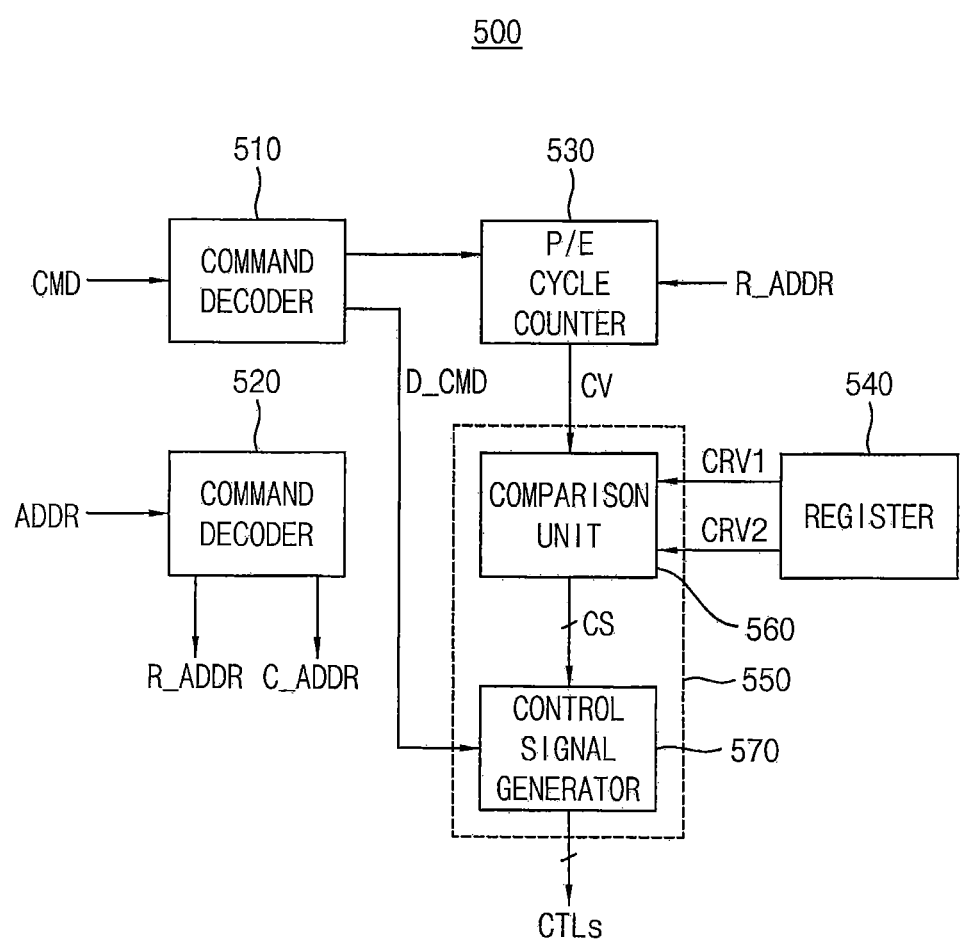
FIG. 9 is a block diagram illustrating a control circuit of the nonvolatile memory device of FIG. 1 according to some example embodiments.

FIG. 9 is a block diagram illustrating the control circuit in the nonvolatile memory device of FIG. 1 according to some example embodiments.

Referring to FIG. 9, the control circuit 500 includes a command decoder 510, an address buffer 520, a program/erase cycle counter 530, a register 540 and a control signal generation unit 550. The control signal generation unit 550 includes a comparison unit 560 and a control signal generator 570.

The command decoder 510 decodes the command CMD and provides a decoded command D_CMD to the control signal generator 570. The command decoder 510 provides the decoded command D_CMD to the program/erase cycle counter 530 when the decoded command D_CMD is a program command or an erase command.

The address buffer 520 receives the address signal ADDR, provides the row address R_ADDR to the program/erase cycle counter 530 and the address decoder 430 and provides the column address C_ADDR to the data input/output circuit 420.

The program/erase cycle counter 530 counts a number of program/erase cycle on the selected memory cells based on the decoded command D_CMD and the row address R_ADDR and provides the comparison unit 560 with a counting value CV which indicates the counted number of the program/erase cycle on the selected memory cells. The counting value CV may indicates a programmed number of memory cells of a particular memory block after the memory block being erased.

The register 540 stores at least first and second reference values CRV1 and CRV2 which are associated with the number of the program/erase cycle and provides the first and second reference values CRV1 and CRV2 to the comparison unit 560. For example, the first and second reference values CRV1 and CRV2 may be reference values for increasing levels of the erase verification voltage, the program voltage and the program verification voltage as the number of the program/erase cycle associated with the selected memory cells increases. For example, the first reference value CRV1 may correspond to 1K of the number of the program/erase cycles and the second reference value CRV2 may correspond to 10K of the number of the program/erase cycles.

The comparison unit 560 compares the counted value CV with the first and second reference values CRV1 and CRV2 and provides the control signal generator 570 with a comparison signal CS indicating a result of comparison of the counted value CV with the first and second reference values CRV1 and CRV2.

The comparison signal CS may include a plurality of bits. When the counted value CV is smaller than the first reference value CRV1, the comparison signal CS may be '00', when the counted value CV is equal to or greater than the first reference value CRV1 and smaller than the second reference value CRV2, the comparison signal CS may be '01', and when the counted value CV is equal to or greater than the second reference value CRV2, the comparison signal CS may be '11'. The first and second reference values CRV1 and CRV2 may be set by testing the nonvolatile memory device 10 in advance.

The control signal generator 570 receives the decoded command D_CMD and the comparison signal CS, generates the control signals CTLs based on an operation directed by the decoded command D_CMD and the number of the program/erase cycles and provides the control signals CTLs to the voltage generator 600.

Figure 10:
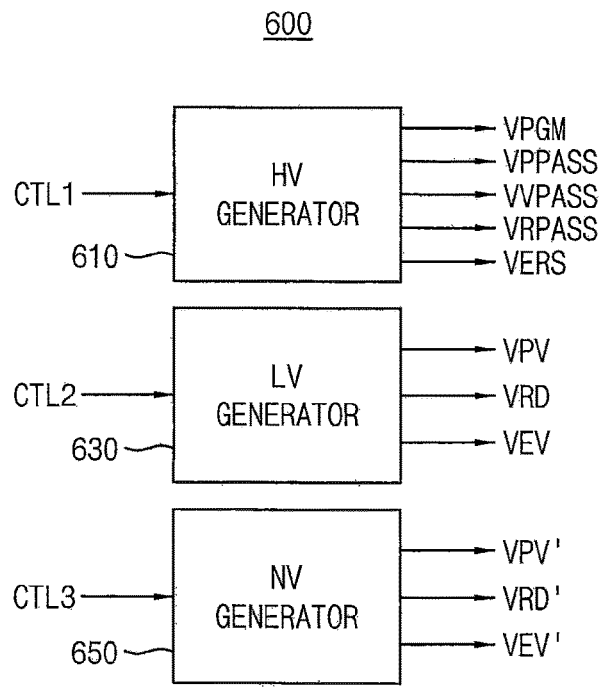
FIG. 10 is a block diagram illustrating a voltage generator of the nonvolatile memory device of FIG. 1 according to some example embodiments.

FIG. 10 is a block diagram illustrating the voltage generator in the nonvolatile memory device of FIG. 1 according to some example embodiments.

Referring to FIG. 10, the voltage generator 600 includes a high voltage generator 610 and a low voltage generator 630. The voltage generator 600 may further include a negative voltage generator 650.

The high voltage generator 610 may generate a program voltage PGM, a program pass voltage VPPASS, a verification pass voltage VVPASS, a read pass voltage VRPASS and an erase voltage VERS according to operations directed by the decoded command D_CMD, in response to a first control signal CTL1. The program voltage PGM is applied to the first word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command D_CMD and the number of the program/erase cycles indicated by the comparison signal CS.

The low voltage generator 630 may generate a program verification voltage VPV, a read voltage VRD and an erase verification voltage VER according to operations directed by the decoded command D_CMD, in response to a second control signal CTL2. The program verification voltage VPV, the read voltage VRD and the erase verification voltage VER may be applied to the first word-line according to operation of the nonvolatile memory device 100. The second control signal CTL2 may include a plurality of bits which indicate the operations directed by the decoded command D_CMD and the number of the program/erase cycles indicated by the comparison signal CS.

The low voltage generator 630 may generate a program verification voltage VPV', a read voltage VRD' and an erase verification voltage VER' which have negative levels according to operations directed by the decoded command D_CMD, in response to a third control signal CTL3. The third control signal CTL3 may include a plurality of bits which indicate the operations directed by the decoded command D_CMD and the number of the program/erase cycles indicated by the comparison signal CS.

Figure 11:
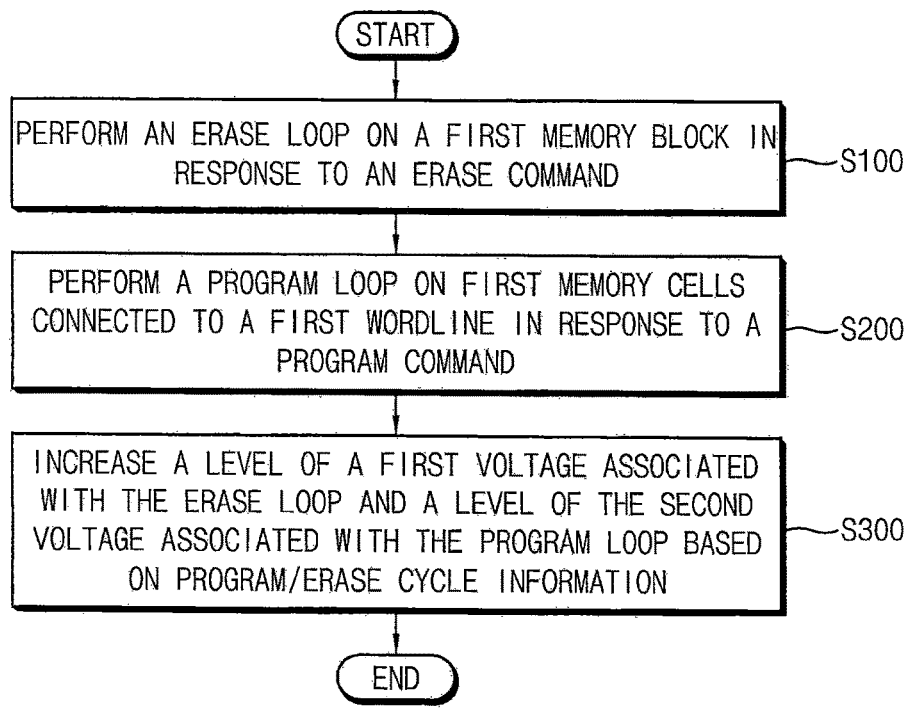
FIG. 11 is a flow chart illustrating operations of a nonvolatile memory device according to some example embodiments.

FIG. 11 is a flow chart illustrating operation of a nonvolatile memory device according to some example embodiments.

Figure 12:
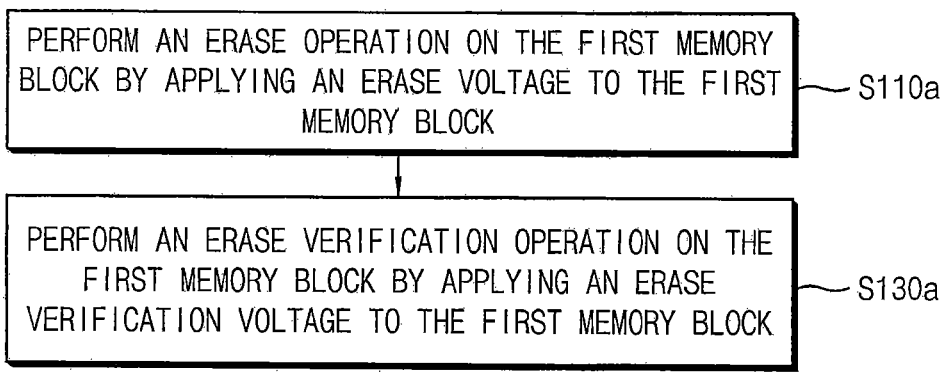
FIG. 12 illustrates an example of an erase loop for the operations of FIG. 11.

FIG. 12 illustrates an example of an erase loop in the operations of FIG. 11.

Figure 13:
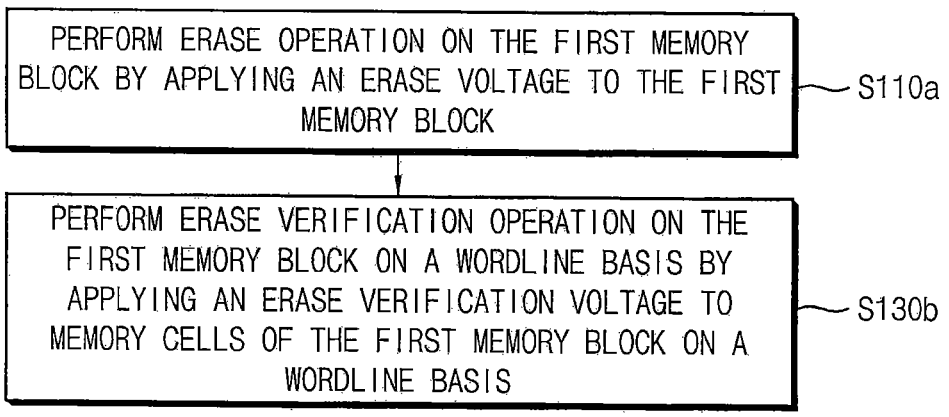
FIG. 13 illustrates another example of an erase loop for the operations of FIG. 11.

FIG. 13 illustrates another example of an erase loop in the operations of FIG. 11.

Figure 14:
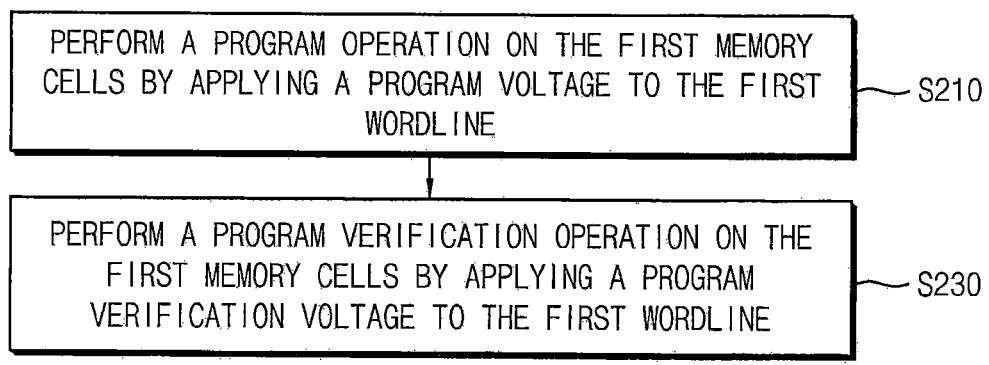
FIG. 14 illustrates a program loop for the operations of FIG. 11.

FIG. 14 illustrates a program loop in the operations of FIG. 11.

Figure 15:
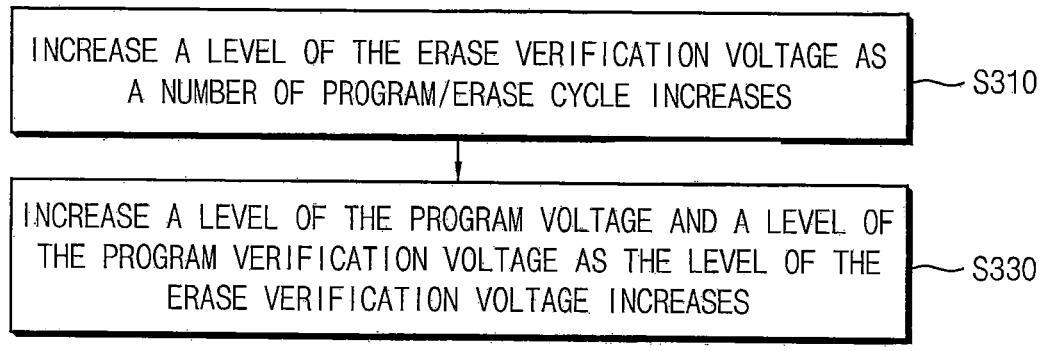
FIG. 15 illustrates voltage level variation according to program/erase cycle information in the operations of FIG. 11.

FIG. 15 illustrates that a voltage level is changed according to program/erase cycle information in the operations of FIG. 11.

The operations of FIGS. 11 through 15 may be performed by the nonvolatile memory device 10 of FIG. 1.

Figure 16:
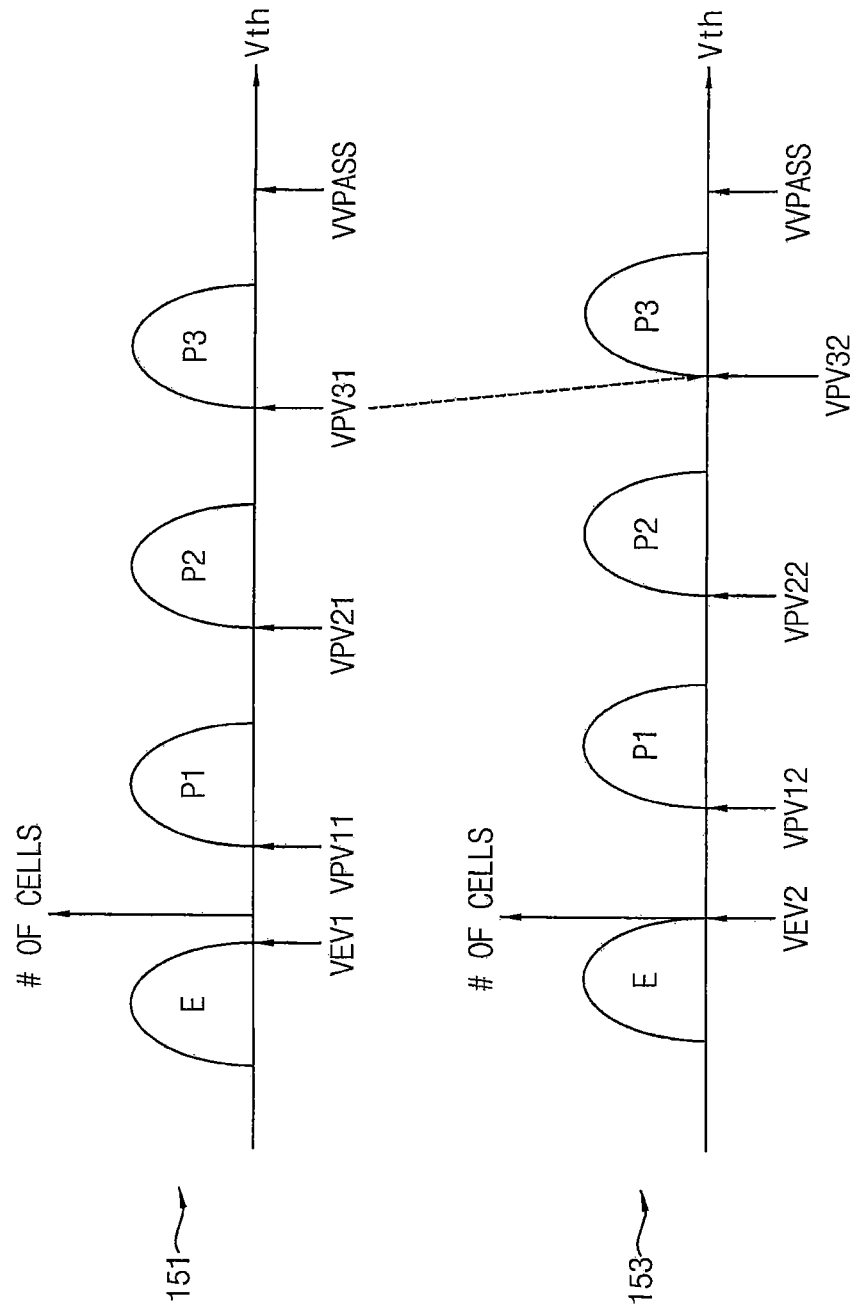
FIG. 16 is a diagram illustrating an example of a threshold voltage distribution of memory cells included in the nonvolatile memory device of FIG. 1.

FIG. 16 is a diagram illustrating an example of a threshold voltage distribution of memory cells included in the nonvolatile memory device of FIG. 1.

In FIG. 16, horizontal-axis represents a threshold voltage of the memory cells, and vertical-axis represents a number of memory cells. FIG. 16 illustrates that each of the memory cells has one of an erased state E, a first program state P1, a second program state P2, and a third program state P3. However, example embodiments are not limited thereto, and a number of program states may be varied.

Since the nonvolatile memory device 10 does not perform a rewrite operation, the nonvolatile memory device 10 may perform the erase operation on memory cells to change a state of the memory cell to the erased state E before performing the program operation on the memory cells. After the memory cells are changed to the erased state E, the program loop may be performed on the memory cells a plurality of times to program each of the memory cells to one of the erase state E, the first program state P1, the second program state P2, and the third program state P3.

The nonvolatile memory device 10 may program selected memory cells by performing a program loop including a program operation, in which a high voltage is applied to the selected memory cells to increase a threshold voltage of the selected memory cells, and a program verification operation, in which the threshold voltage of the selected memory cells is verified, a plurality of times.

In FIG. 16, a reference numeral 151 denotes a case that a program loop is performed after an initial erase loop is performed on the selected first memory cells, and reference numeral 153 denotes a case that program/erase cycles greater than a reference value are performed on the selected first memory cells.

As the reference numeral 151 indicates, an erase verification voltage VEV1 for verifying the erased state E has a negative voltage level, a threshold voltage of memory cells in the first program state P1 may be higher than a first program verification voltage VPV11, a threshold voltage of memory cells in the second program state P2 may be higher than a second program verification voltage VPV21, and a threshold voltage of memory cells in the third program state P3 may be higher than a third program verification voltage VPV31. The first through third program verification voltages VPV11, VPV21 and VPV31 may be positive.

During a program verification operation, the verification pass voltage VVPASS, which has a sufficiently high voltage level, may be applied to the unselected word-lines such that memory cells coupled to the unselected word-lines may be turned on regardless of the program states E and P1~P3.

As the program/erase cycles on the first memory cells increase, interfacial density may be increased because an interface between a channel and a tunnel oxide layer of a memory cell may become degraded. When the interfacial density is increased, a threshold voltage of memory cells in the erased state E tends to move in a positive direction because sub-threshold swings of the memory cells increase. For compensating for the movement in the positive direction of the threshold voltage of memory cells in the erased state E, additional erase voltage is applied to a memory block in a conventional scheme. However, an endurance characteristic of the memory cells may be degraded by an erase stress due to the additional erase voltage.

To reduce or prevent degradation of the endurance characteristic of the memory cells, as a reference numeral 153 indicates, a level of an erase verification voltage VEV2 for verifying the erased state E is increased as the number of the program/erase cycles on the selected first memory cells increases. In addition, a level of a program voltage applied to the first memory cells during the program operation may be increased and a level of a program verification voltage applied to the first memory cells during the program verification operation may be increased.

Therefore, a threshold voltage of memory cells in the first program state P1 may be higher than a first program verification voltage VPV12, a threshold voltage of memory cells in the second program state P2 may be higher than a second program verification voltage VPV22, and a threshold voltage of memory cells in the third program state P3 may be higher than a third program verification voltage VPV32. The first program verification voltage VPV12 is higher than the first program verification voltage VPV11, the second program verification voltage VPV22 is higher than the second program verification voltage VPV21, and the third program verification voltage VPV32 is higher than the third program verification voltage VPV31.

When the number of the program/erase cycles is smaller than a first reference value CRV1, the erase verification operation may be performed based on the erase verification voltage VEV1 and the program verification operation may be performed based on the first through third program verification voltages VPV11~PVPV31. When the number of the program/erase cycles is equal to or greater than the first reference value CRV1 and smaller than a second reference value CRV2, the erase verification operation may be performed based on the erase verification voltage VEV2 and the program verification operation may be performed based on the first through third program verification voltages VPV12~PVPV32. When the number of the program/erase cycles is equal to or greater than the second reference value CRV2, the erase verification operation may be performed based on an erase verification voltage higher than the erase verification voltage VEV2 and the program verification operation may be performed based on program verification voltages, each higher than each of the first through third program verification voltages VPV12~PVPV32.

Hereinafter, operations of a nonvolatile memory device 10 will be described with reference to FIGS. 1 to 16.

Referring to FIG. 11, when the nonvolatile memory device 10 receives an erase command from an external device (e.g., a memory controller), the nonvolatile memory device 10 may perform an erase loop a first memory block of the memory blocks BLK1~BLKz by applying the erase voltage VERS to the first memory block (S100). The erase loop may include the erase operation and the erase verification operation.

When the nonvolatile memory device 10 receives a program command from an external device (e.g., a memory controller) after the first memory block is erased, the nonvolatile memory device 10 may perform a program loop on first memory cells connected to a first word-line, of the first memory block (S200). The program loop may include the program operation and the program verification operation.

When the program/erase cycles on the first memory cells are repeated, the nonvolatile memory device 10 may increase a level of a first voltage associated with the erase loop and a level of a second voltage associated with the program loop based on the program/erase cycle information on the first memory cells (S300). The program/erase cycle information on the first memory cells may be the number of the program/erase cycles, the level of the first voltage may be a level of the erase verification voltage and the level of the second voltage may be levels of the program voltage during the program operation and the level of the program verification voltage during the program verification voltage.

FIG. 12 illustrates an example of an erase loop of the operations of FIG. 11.

For performing the erase loop on the first memory block (S100a), the nonvolatile memory device 10 erases the first memory block by applying the erase voltage to the first memory block (S110a) and performs the erase verification operation on the memory cells by applying the erase verification voltage to entire word-lines in the first memory block (S130a). The erase verification operation may be performed on a memory block basis.

FIG. 13 illustrates another example of an erase loop of the operations of FIG. 11.

For performing the erase loop on the first memory block (S100b), the nonvolatile memory device 10 erases the first memory block by applying the erase voltage to the first memory block (S110a) and performs the erase verification operation on the memory cells by applying the erase verification voltage sequentially to the word-lines in the first memory block on a word-line basis (S130b). The erase verification operation may be performed on a word-line basis.

FIG. 14 illustrates an example of a program loop of the operations of FIG. 11.

For performing the program loop on the first memory cells connected to the first word-line (S200), the nonvolatile memory device 10 performs the program operation on the first memory cells by applying the program voltage VPGM to the first word-line connected to the first memory cells (S210). The control circuit 500 controls the voltage generator 600 to apply the program voltage VPGM to the first word-line through the first control signal CTL1.

After the program operation is performed, the nonvolatile memory device 10 performs the program verification operation on the first memory cells by applying the program verification voltage VPV to the first word-line connected to the first memory cells (S230). The control circuit 500 controls the voltage generator 600 to apply the program verification voltage VPV to the first word-line through the first control signal CTL1.

FIG. 15 illustrates that a voltage level is changed according to program/erase cycle information of the operations of FIG. 11.

For increasing the level of the first voltage associated with the erase loop and the level of the second voltage associated with the program loop based on the program/erase cycle information (S300), the nonvolatile memory device 10 may increase the level of the erase verification voltage VEV according to an increase of the number of the program/erase cycles (S310), and may increase the levels of the program voltage VPGM and the program verification voltage VPV according to the increased level of the erase verification voltage VEV (S330).

For increasing the level of the erase verification voltage VEV according to an increase of the number of the program/erase cycles, the control circuit 500 may increase the erase verification voltage VEV through the second control signal CTL2 as in FIG. 16. For increasing the levels of the program voltage VPGM and the program verification voltage VPV according to the increased level of the erase verification voltage VEV, the control circuit 500 may increase the levels of the program voltage VPGM and the program verification voltage VPV through the first control signal CTL1 and the second control signal CTL2 as in FIG. 16.

Figure 17:
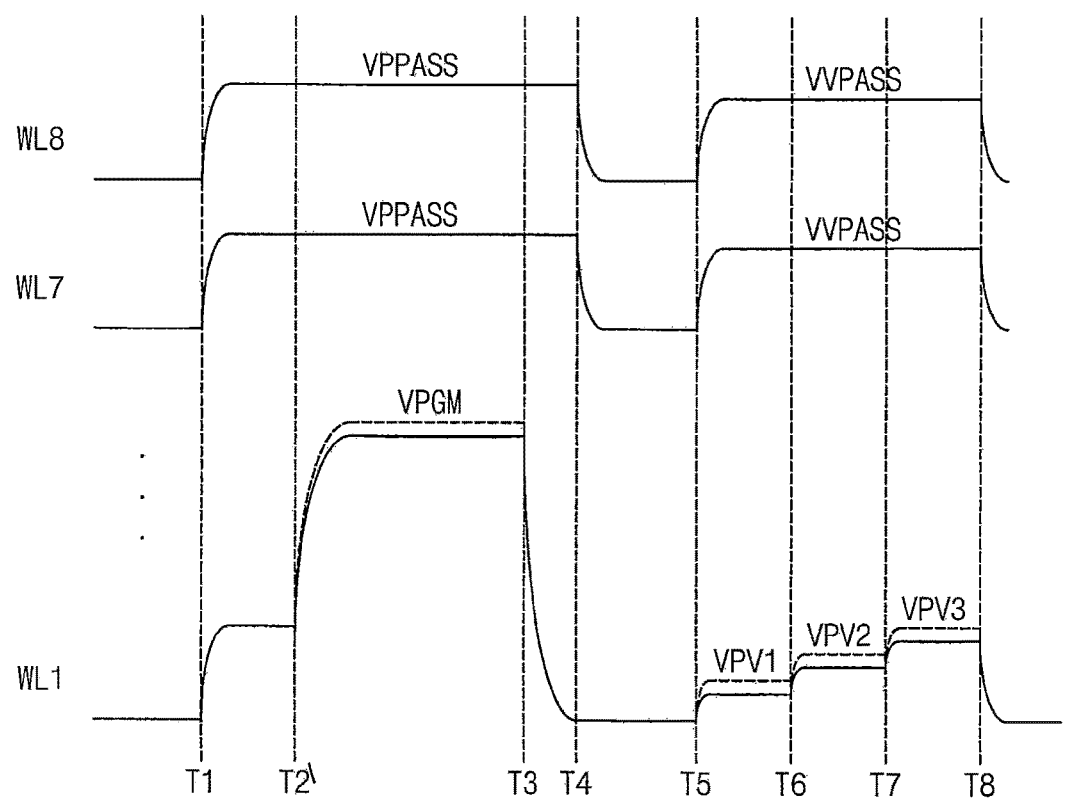
FIG. 17 is a diagram illustrating an example of a program loop according to the program/erase cycle information of the operations of FIG. 11.

FIG. 17 is a diagram for describing an example of a program loop according to the program/erase cycle information of the operations of FIG. 11.

In FIG. 17, the first word-line WL1 corresponds to the selected word-line, and the second through eighth word-lines WL2~WL8 correspond to the unselected word-lines.

For example, in the program stage of the program loop of FIG. 17, at a first time T1, the high voltage generator 610 may apply the program pass voltage VPPASS to the first word-line WL and may apply the program pass voltage VPPASS to the unselected word-lines.

At a second time T2, the high voltage generator 610 may perform the program operation on the first memory cells connected to the first word-line WL1 by applying the program voltage VPGM, which is higher than the program pass voltage VPPASS, to the selected word-line WL1.

At a third time T3, the selected word-line WL1 may be discharged to the ground voltage GND. At a fourth time T4, the unselected word-lines WL2~WL8 may be discharged to the ground voltage GND.

In the program verification stage of the program loop, at a fifth time T5, the low voltage generator 630 may apply the first program verification voltage VPV1 to the selected word-line WL1 and the high voltage generator 610 may apply the verification pass voltage VVPASS to the unselected word-lines WL2~WL8.

After the voltage of the selected word-line WL1 is stabilized to the first program verification voltage VPV1 at the fifth time T5, the nonvolatile memory device 10 may perform the program verification operation on the first memory cells based on the first program verification voltage VPV1.

At a sixth time T6, the low voltage generator 630 may apply may apply the second program verification voltage VPV2 to the selected word-line WL1, and perform the program verification operation on the first memory cells based on the second program verification voltage VPV2.

At a seventh time T7, the low voltage generator 630 may apply may apply the third program verification voltage VPV3 to the selected word-line WL1, and perform the program verification operation on the first memory cells based on the third program verification voltage VPV3.

At an eighth time T8, the selected word-line WL1 and the unselected word-lines WL2~WL8 may be discharged to the ground voltage GND.

In FIG. 17, the program voltage VPGM and the program verification voltages VPV1~VPV3 with a solid line indicates a case when the number of the program/erase cycles performed on the first memory cells is smaller than the reference value and the program voltage VPGM and the program verification voltages VPV1~VPV3 with a dotted line indicates a case when the number of the program/erase cycles performed on the first memory cells is greater than the reference value.

As described above, after increasing the level of the erase verification voltage according to the increase of the number of the program/erase cycles on the first memory cells, the nonvolatile memory device 10 increases the levels of the program voltage VPGM and the program verification voltages VPV1~VPV3 such that a regular gap (program/erase window) between the threshold voltage distribution in the erased state E and the threshold voltage distribution in the program state P3 is maintained. Therefore, the degradation of the endurance characteristics of the memory cells due to the increase of the number of the program/erase cycles may be reduced or prevented.

Figure 18:
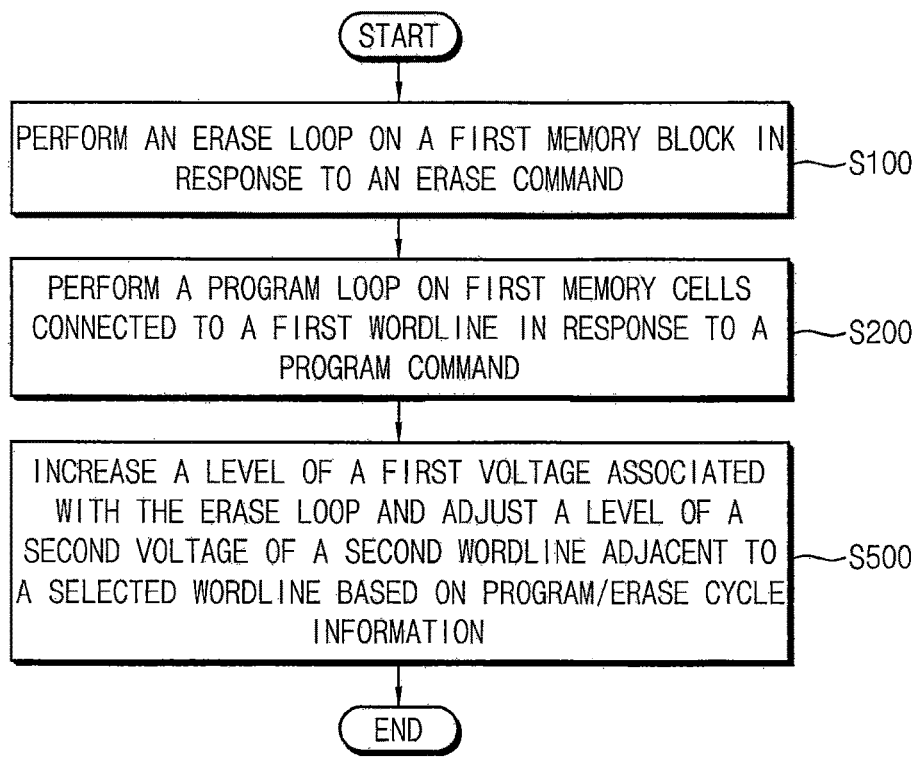
FIG. 18 is a flow chart illustrating operations of a nonvolatile memory device according to some example embodiments.

FIG. 18 is a flow chart illustrating operations of a nonvolatile memory device according to some example embodiments.

The operations of FIG. 18 may be performed by the nonvolatile memory device 10 of FIG. 1.

When the nonvolatile memory device 10 receives an erase command from an external device (e.g., a memory controller), the nonvolatile memory device 10 may perform an erase loop a first memory block of the memory blocks BLK1~BLKz by applying the erase voltage VERS to the first memory block (S100). The erase loop may include the erase operation and the erase verification operation.

When the nonvolatile memory device 10 receives a program command from an external device (e.g., a memory controller) after the first memory block is erased, the nonvolatile memory device 10 may perform a program loop on first memory cells connected to a first word-line, of the first memory block (S200). The program loop may include the program operation and the program verification operation.

When the program/erase cycles on the first memory cells are repeated, the nonvolatile memory device 10 may increase a level of a first voltage associated with the erase loop and change a level of a second voltage of a second word-line adjacent to the first word-line during a memory operation being performed on the first memory cells (S500). The memory operation may include the program verification operation on the first memory cells or a read operation on the first memory cells.

Figure 19:
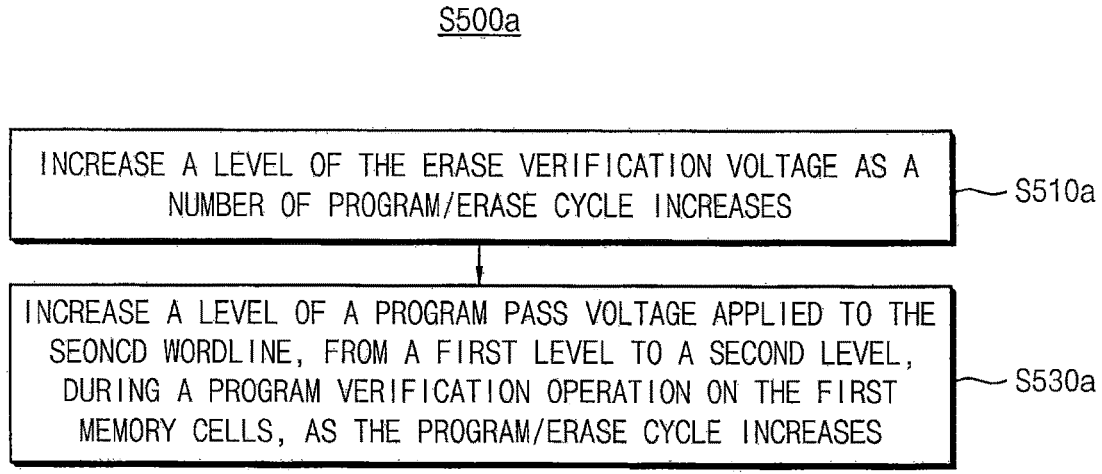
FIG. 19 illustrates an example of voltage variation for the operations of FIG. 18.

FIG. 19 illustrates an example that the level of the first voltage is increased and the level of the second voltage is changed in the operations of FIG. 18.

For increasing the first level and changing the second level (S500a), the nonvolatile memory device 10 may increase the level of the erase verification voltage VEV according to the increase of the number of the program/erase cycles (S510a), and may increase the program pass voltage VVPASS applied to the second word-line adjacent to the first word-line from a first level to a second level during the program verification operating being performed on the first memory cells (S530a).

Figure 20:
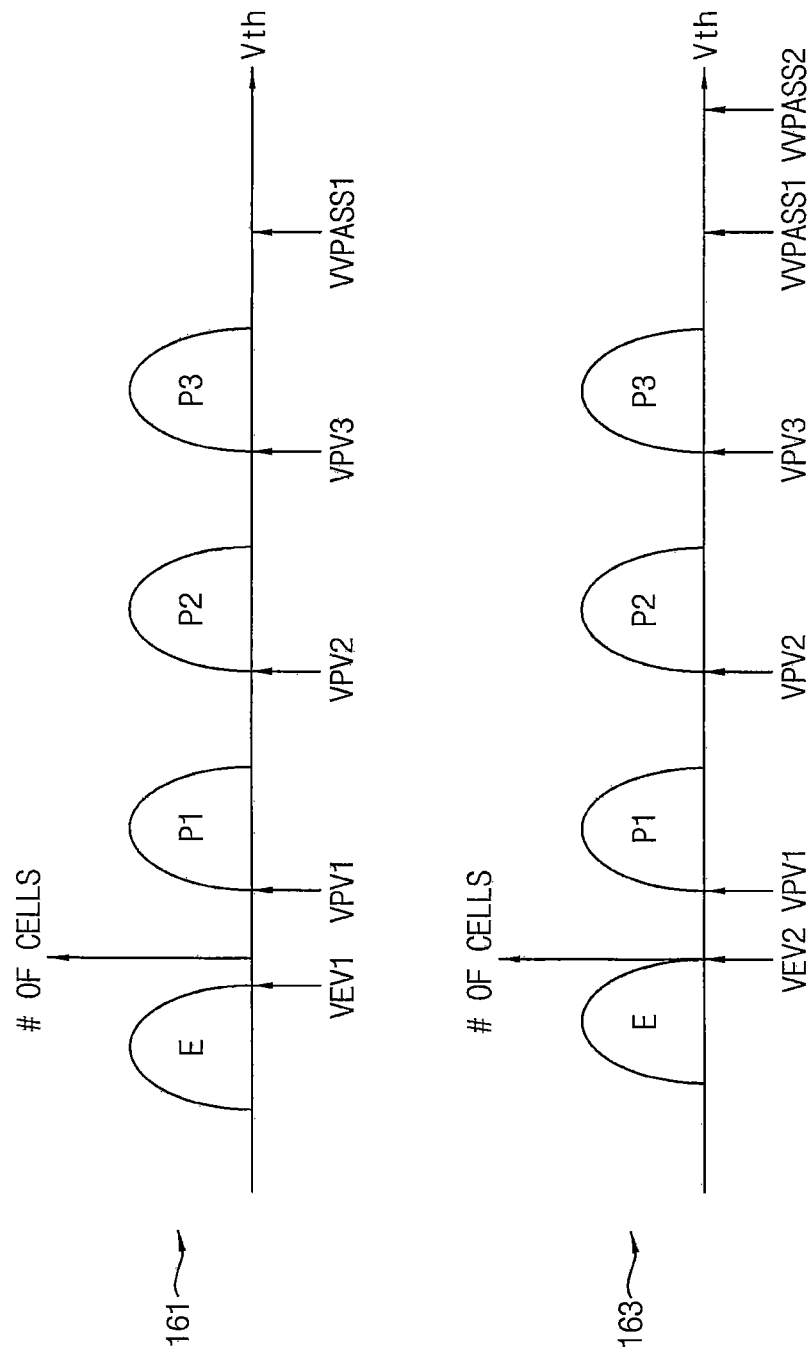
FIG. 20 is a diagram illustrating an example of a threshold voltage distribution of memory cells included in the nonvolatile memory device of FIG. 1.

FIG. 20 is a diagram illustrating an example of a threshold voltage distribution of memory cells included in the nonvolatile memory device of FIG. 1.

In FIG. 20, horizontal-axis represents a threshold voltage of the memory cells, and vertical-axis represents a number of memory cells. FIG. 20 illustrates that each of the memory cells has one of an erased state E, a first program state P1, a second program state P2, and a third program state P3. However, example embodiments are not limited thereto, and a number of program states may be varied.

In FIG. 20, a reference numeral 161 denotes a case that a program loop is performed after an initial erase loop is performed on the selected first memory cells, and reference numeral 163 denotes a case that program/erase cycles greater than a reference value are performed on the selected first memory cells.

As the reference numeral 161 indicates, an erase verification voltage VEV1 for verifying the erased state E has a negative voltage level, a threshold voltage of memory cells in the first program state P1 may be higher than a first program verification voltage VPV1, a threshold voltage of memory cells in the second program state P2 may be higher than a second program verification voltage VPV2, and a threshold voltage of memory cells in the third program state P3 may be higher than a third program verification voltage VPV3. The first through third program verification voltages VPV1, VPV2 and VPV3 may have a positive voltage level. During the program verification operation, a verification pass voltage VVPASS1 having a first level, which has a sufficiently high voltage level, may be applied to the unselected word-lines such that memory cells coupled to the unselected word-lines may be turned on regardless of the program states E and P1~P3.

As described above, as the program/erase cycles on the first memory cells increase, interfacial density may be increased because an interface between a channel and a tunnel oxide layer of a memory cell is degraded. When the interfacial density is increased, a threshold voltage of memory cells in the erased state E tends to move toward a positive direction because sub-threshold swings of the memory cells increase. For compensating for the movement, as a reference numeral 163 indicates, a level of an erase verification voltage VEV2 for verifying the erased state E is increased as the number of the program/erase cycles on the first memory cells increases. In addition, during the program verification operation, a verification pass voltage VVPASS2 having a second level higher than the first level is applied to the second word-line adjacent to the first word-line and the verification pass voltage VVPASS1 having the first level is applied to the unselected word-lines except for the second word-line. Therefore, endurance characteristics of the memory cells may be maintained by enhancing coupling phenomenon although the number of the program/erase cycles increases.

Figure 21:
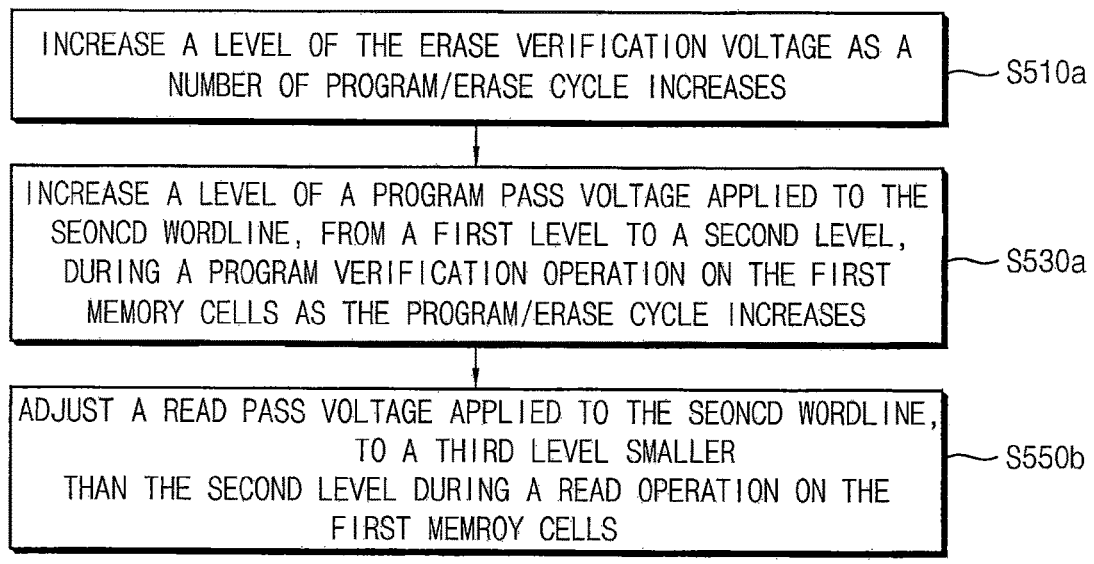
FIG. 21 illustrates another example of voltage variation for the operations of FIG. 18.

FIG. 21 illustrates an example that the level of the first voltage is increased and the level of the second voltage is changed in the method of FIG. 18.

For increasing the first level and changing the second level (S500*b*), the nonvolatile memory device 10 may increase the level of the erase verification voltage VEV according to the increase of the number of the program/erase cycles (S510*a*), may increase the program pass voltage VVPASS applied to the second word-line adjacent to the first word-line from a first level to a second level during the program verification operating being performed on the first memory cells (S530*a*), and may adjust a read pass voltage applied to the second word-line to a third level smaller than the second level (S550*b*).

Figure 22:
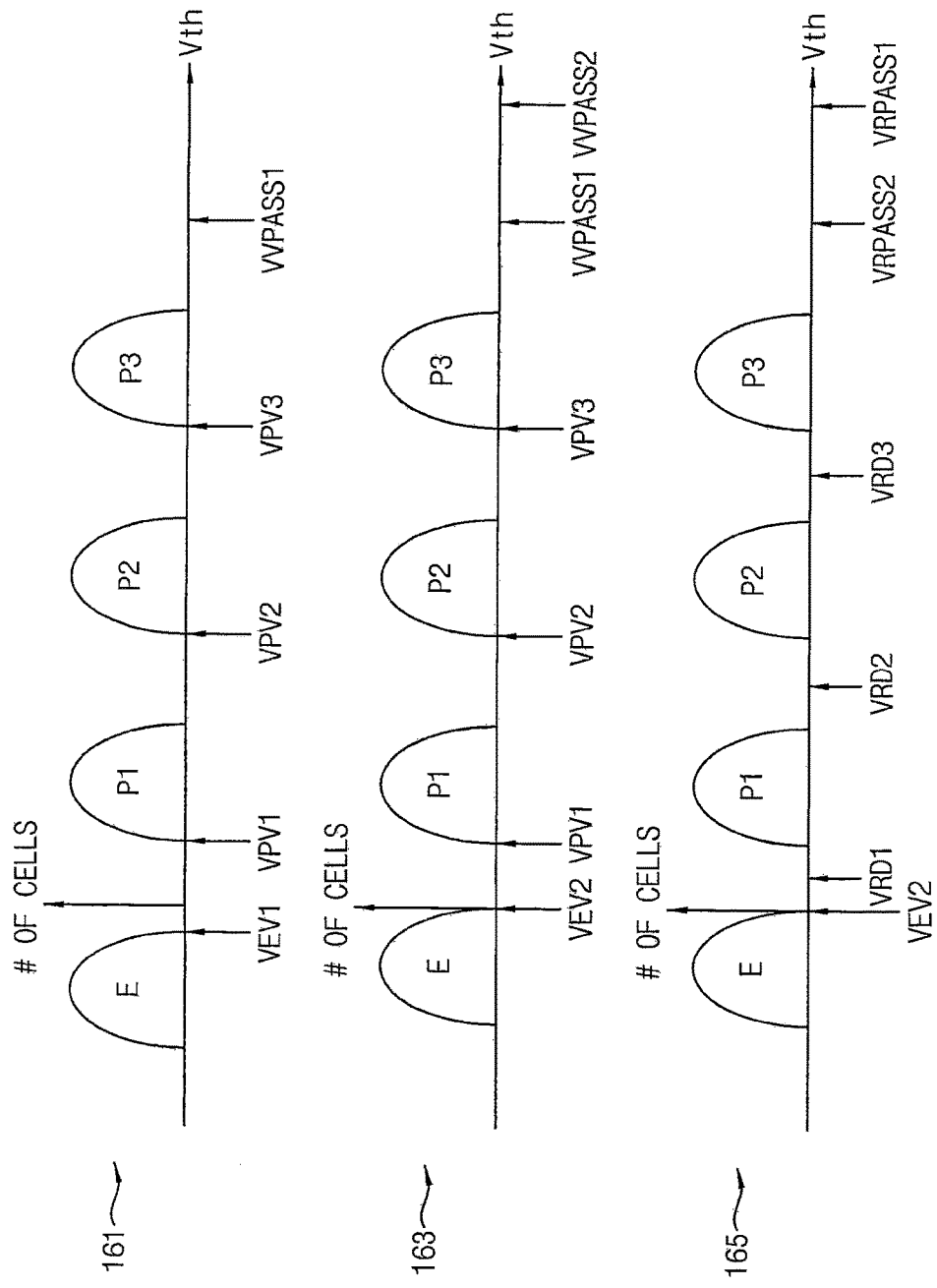
FIG. 22 is a diagram illustrating an example of a threshold voltage distribution of memory cells included in the nonvolatile memory device of FIG. 1.

FIG. 22 is a diagram illustrating an example of a threshold voltage distribution of memory cells included in the nonvolatile memory device of FIG. 1.

FIG. 22, compared with FIG. 20, further illustrates a read operation performed on the first memory cells in response to a read command as a reference numeral 165 indicates after the program loop is performed on the first memory cells.

After the program operation is performed on the memory cells included in the nonvolatile memory device 10, the read operation may be performed on the first memory cells based on the threshold voltage of the first memory cells.

As the reference numeral indicates 165, in the read operation, the program states E and P1~P3 of each of the first memory cells may be determined based on a first read voltage VRD1, a second read voltage VRD2, and a third read voltage VRD3. Each of the first through third read voltages VRD1~VRD3 may have a positive level.

During a read operation, a second read pass voltage VRPASS2 may be applied to the second word-line adjacent to the first word-line coupled to the first memory cells, and a first read pass voltage VRPASS1 to the unselected word-lines except for the second word-line. The first and second read pass voltages VRPASS1 and VRPASS2 may have a sufficiently high voltage level such that memory cells coupled to the unselected word-lines may be turned on regardless of the program states E and P1~P3. In addition, the level of the first read pass voltage VRPASS1 may be substantially the same as the level of the verification pass voltage VVPASS2 and the level of the second read pass voltage VRPASS2 may be smaller than the level of the verification pass voltage VVPASS2.

Figure 23:
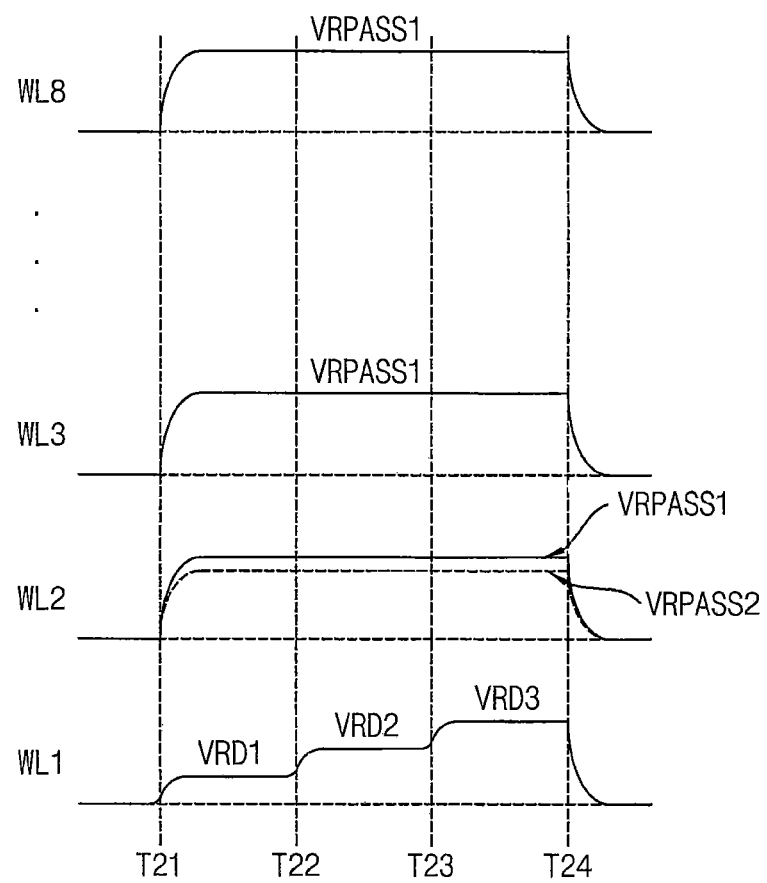
FIG. 23 is a diagram illustrating an example of the operations of FIG. 21.

FIG. 23 is a diagram for describing an example of the operations of FIG. 21.

In FIG. 23, the first word-line WL1 corresponds to the selected word-line and the second through eighth word-lines WL2~WL8 correspond to the unselected word-lines.

Referring to FIGS. 1, 9, 10 and 21 through 23, when the nonvolatile memory device 10 receives a read command from an external device (e.g., a memory controller), the voltage generator 600 applies the first read voltage VRD1 to the first word-line WL1 and applies the read pass voltage VRPASS1 to the unselected word-lines WL2~WL8 at a first time T21. After the voltage of the first word-line WL1 is stabilized to the first read voltage VRD1 at the first time T21, the nonvolatile memory device 10 may determine whether the first memory cells coupled to the first word-line WL1 is turned on.

At a second time T22, the voltage generator 600 applies the second read voltage VRD2, which is higher than the first read voltage VRD1, to the first word-line WL1 and determines whether the selected memory cell coupled to the selected word-line WL1 is turned on. At a third time T23, the voltage generator 600 applies the third read voltage VRD3, which is higher than the second read voltage VRD2, to the first word-line WL1 and determines whether the selected memory cell coupled to the selected word-line WL1 is turned on. At a fourth time T24, the first word-line WL1 and the unselected word-lines WL2~WL8 may be discharged to the ground voltage GND.

In FIG. 23, when the number of the program/erase cycles on the first memory cells is greater than the reference value as the program/erase cycles on the first memory cells are repeated, the read pass voltage VRPASS2 lower than the read pass voltage VRPASS1 is applied to the second word-line WL2 adjacent to the first word-line WL1 and the read pass voltage VRPASS1 is applied to the word-lines WL3~WL8.

As described above, the nonvolatile memory device 10 increases the level of the erase verification voltage according to the increase of the number of the program/erase cycles on the first memory cells and adjusts the levels of the program pass voltage and the read pass voltage, which are applied to the second word-line adjacent to the first word-line after completion of the program loop. Therefore, endurance characteristics of the memory cells may be maintained.

Figure 24:
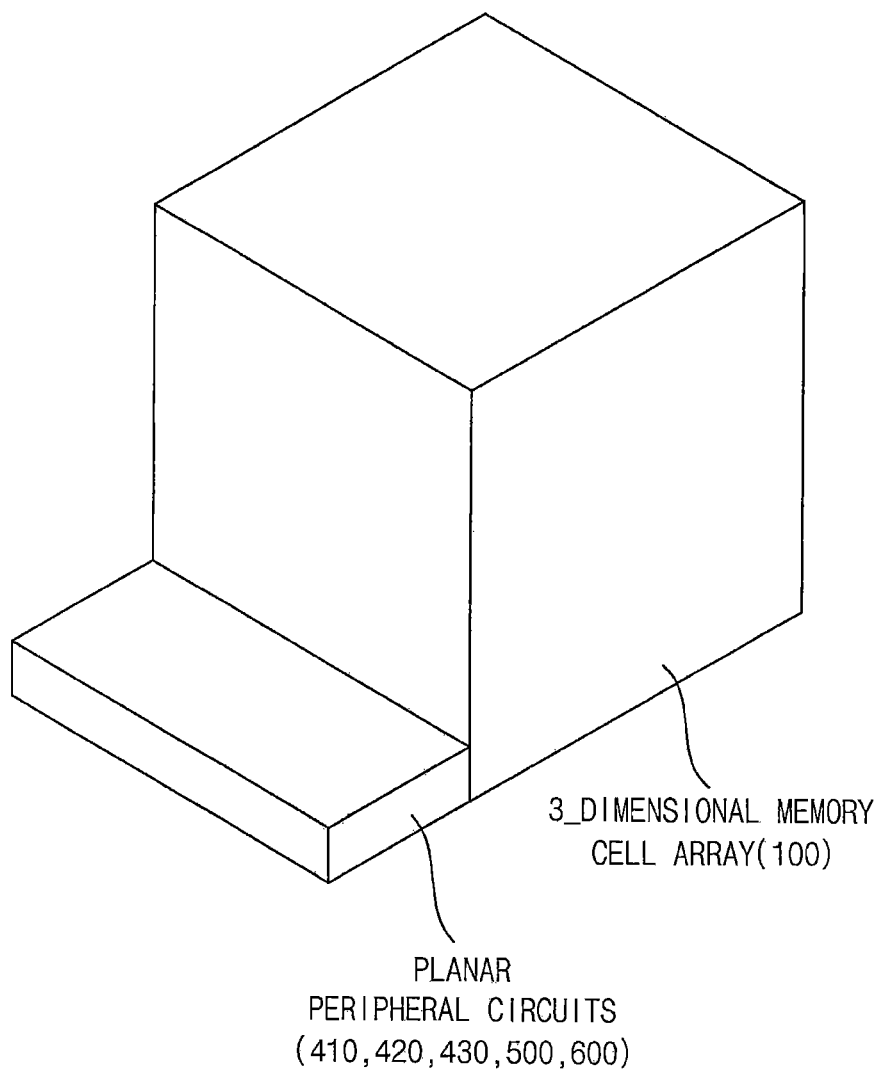
FIG. 24 is a perspective view illustrating a structure of the nonvolatile memory device described with reference to FIG. 1 according to some example embodiments.

FIG. 24 is a perspective view illustrating a structure of the nonvolatile memory device described with reference to FIG. 1.

Referring to FIG. 24, the nonvolatile memory device 10 includes a three-dimensional memory cell array 100 and plane peripheral circuits 410, 420, 430, 500, and 600.

As described with reference to FIGS. 6 through 8, the memory cell array 100 includes memory cells stacked in a direction intersecting the substrate 111. The memory cell array 100 has a three-dimensional structure in which memory cells are three-dimensionally arranged. The peripheral circuits 410, 420, 430, 500, and 600 include devices provided on the substrate 111 in a single layer. The peripheral circuits 410, 420, 430, 500, and 600 include devices having a plane structure.

For example, it is illustrated that the peripheral circuits 410, 420, 430, 500, and 600 are provided at one side of the three-dimensional memory cell array 110. However, the position relationship of the peripheral circuits 410, 420, 430, 500, and 600 and their number are not limited.

For example, the peripheral circuits 410, 420, 430, 500, and 600 may be provided on at least two sides of the three-dimensional memory cell array 100. Additionally, at least two three-dimensional memory cell arrays 100 are provided and the plane peripheral circuits 410, 420, 430, 500, and 600 may be provided on at least one side of each of at least two three-dimensional memory cell arrays 100.

Figure 25:
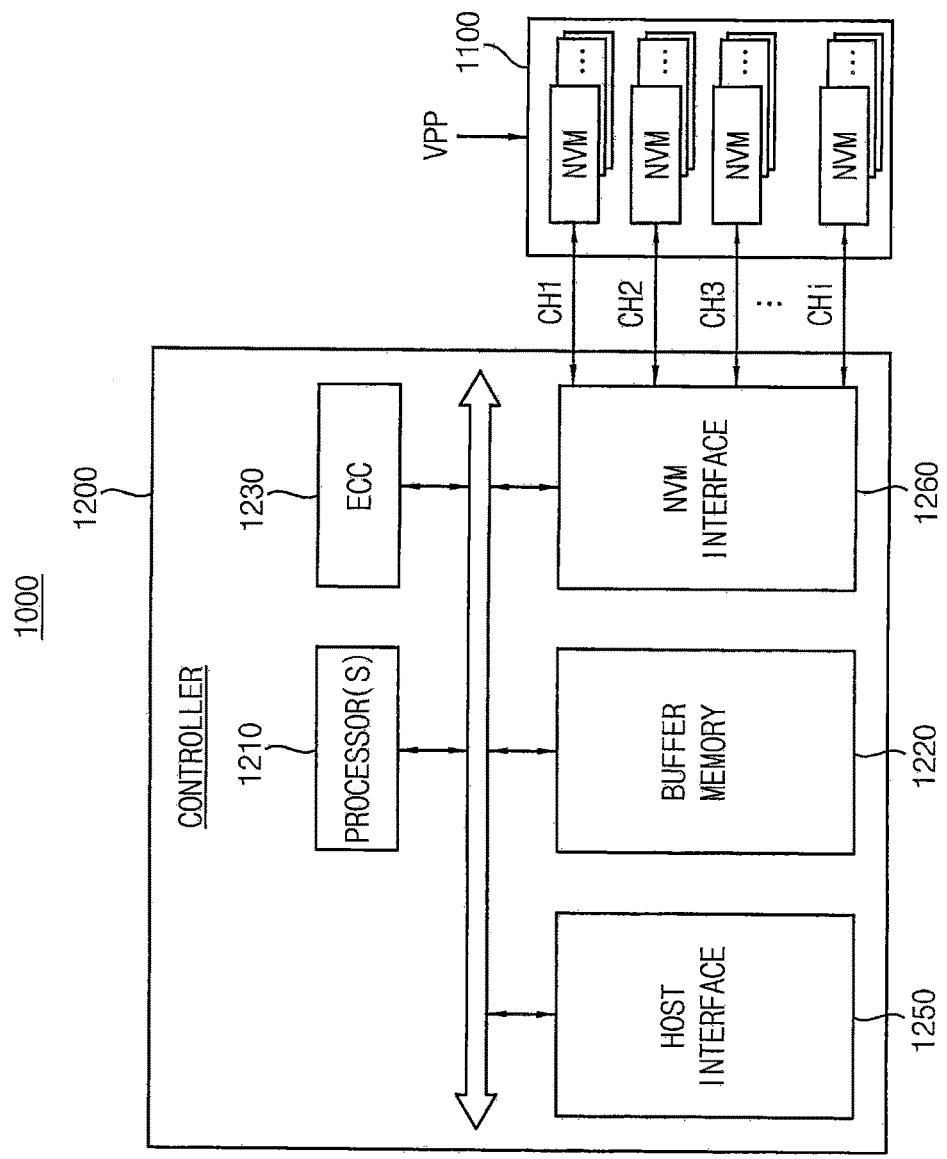
FIG. 25 is a block diagram illustrating a solid state disk or solid state drive (SSD) according to some example embodiments.

FIG. 25 is a block diagram illustrating a solid state disk or solid state drive (SSD) according to some example embodiments.

Referring to FIG. 25, SSD 1000 includes multiple non-volatile memory devices 1100 and an SSD controller 1200.

The nonvolatile memory devices 1100 may be optionally supplied with an external high voltage VPP. Each of the nonvolatile memory devices 1100 may include the nonvolatile memory device 10 of FIG. 1. Each of the nonvolatile memory devices 1100 may increase a level of a first voltage associated with an erase loop for erasing first memory cells while increasing a level of a second voltage associated with a program loop for programming the first memory cells or may adjusting a level of a voltage applied to a second word-line adjacent to a first word-line connected to the first memory cells during the a memory operation on the first memory cells, based on the program/erase cycle information on the first memory cells. Therefore, each of the nonvolatile memory devices 1100 may enhance performance by preventing degradation of the endurance characteristics of the memory cells in spite of the increase of the number of the program/erase cycles.

The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. Although FIG. 19 illustrates an embodiment where the buffer memory 1220 is included in the SSD controller 1200, the inventive concept is not limited thereto. Alternatively, for instance, the buffer memory 1220 may be placed outside the SSD controller 1200.

The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100. Although not shown in FIG. 19, a code memory may be further included to store code data needed to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

Figure 26:
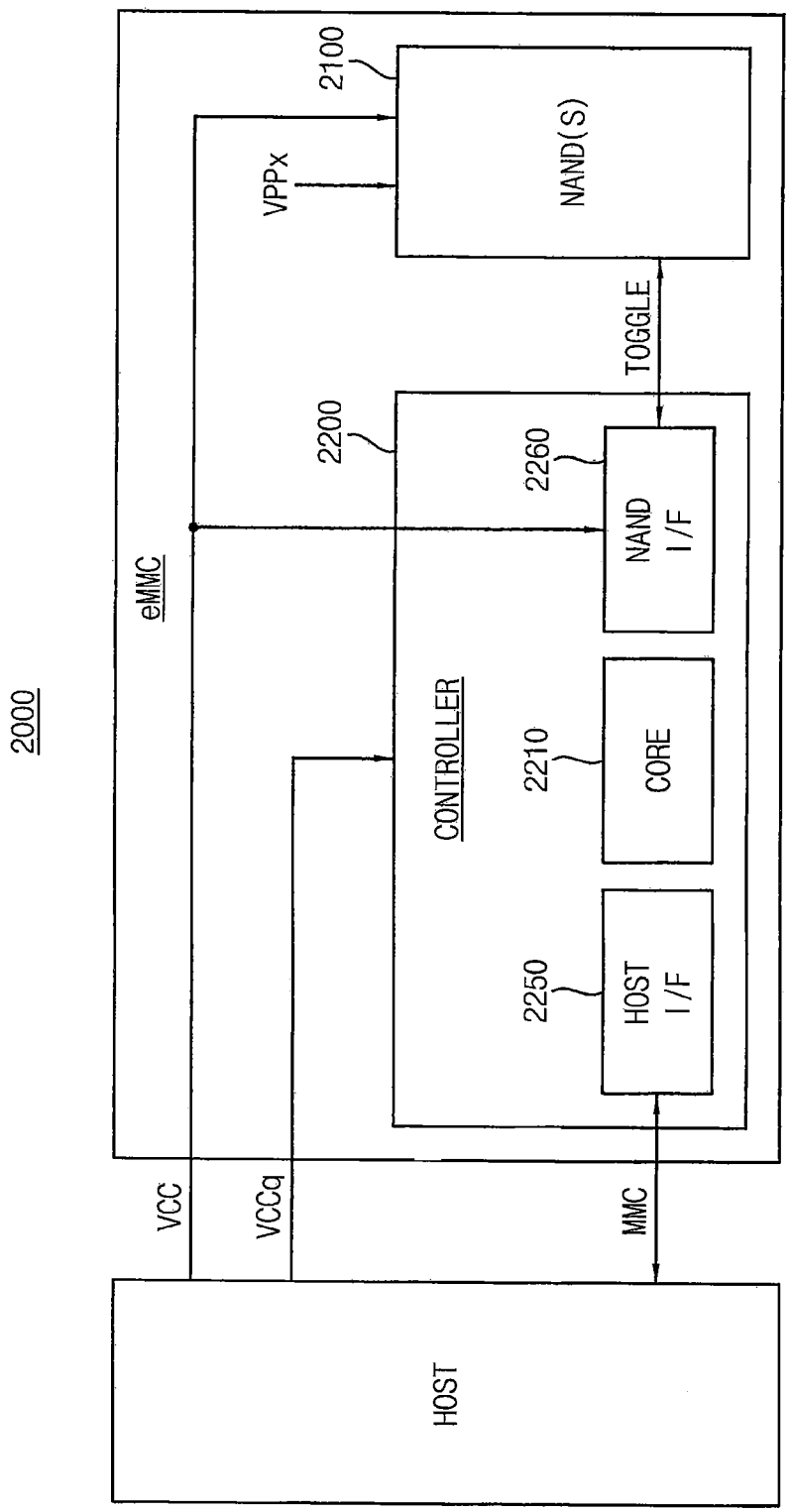
FIG. 26 is a block diagram illustrating an embedded multi-media card (eMMC) according to some example embodiments.

FIG. 26 is a block diagram illustrating an embedded multi-media card (eMMC) according to some example embodiments.

Referring to FIG. 26, an eMMC 2000 includes one or more NAND flash memory devices 2100 and a controller 2200.

The NAND flash memory device 2100 may include the nonvolatile memory device 10 of FIG. 1. The NAND flash memory device 2100 may increase a level of a first voltage associated with an erase loop for erasing first memory cells while increasing a level of a second voltage associated with a program loop for programming the first memory cells or may adjusting a level of a voltage applied to a second word-line adjacent to a first word-line connected to the first memory cells during the a memory operation on the first memory cells, based on the program/erase cycle information on the first memory cells. Therefore, the NAND flash memory device 2100 may enhance performance by preventing degradation of the endurance characteristics of the memory cells in spite of the increase of the number of the program/erase cycles.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The host interface 2250 is configured to perform an interface between the controller 2210 and a host. The NAND interface 2260 is configured to provide an interface between the NAND flash memory device 2100 and the controller 2200. In some example embodiments, the host interface 2250 may be a parallel interface (e.g., an MMC interface). In some example embodiments, the host interface 2250 of eMMC 2000 may be a serial interface (e.g., UHS-II, UFS, etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In some embodiments, eMMC 2000 may be optionally supplied with an external high voltage VPPx.

Figure 27:
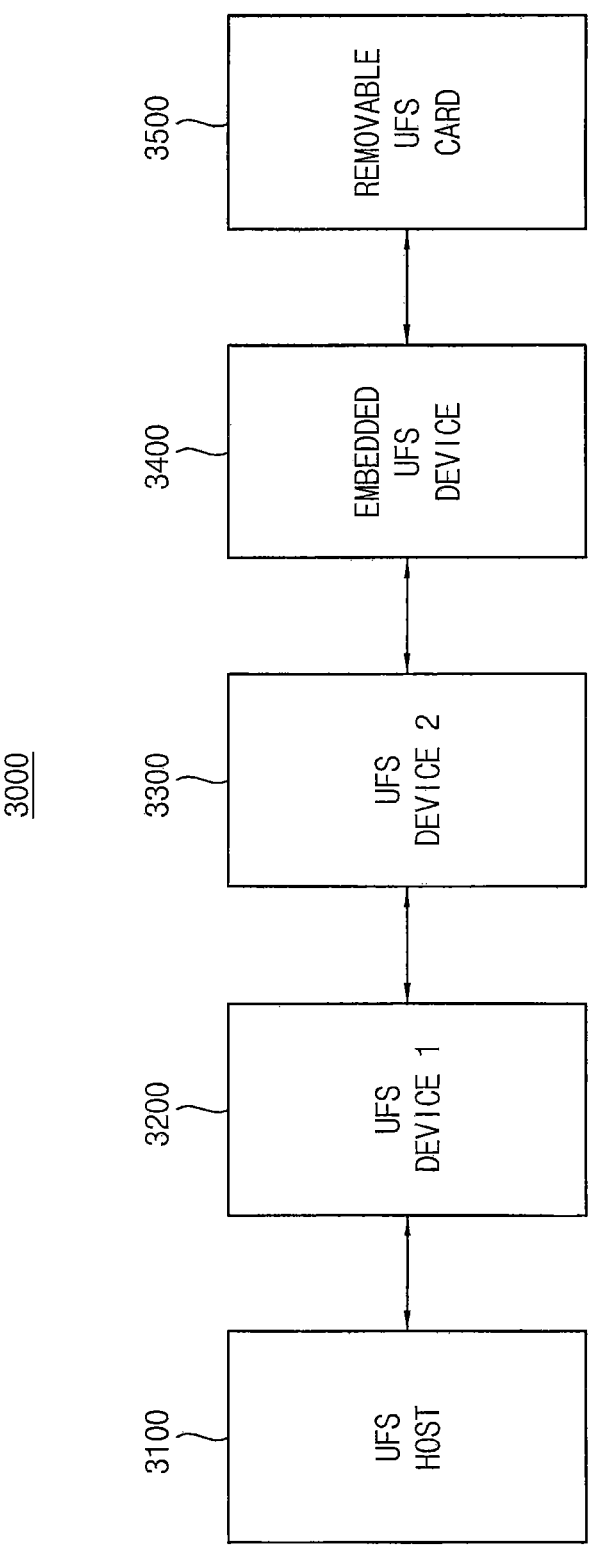
FIG. 27 is a block diagram illustrating a universal flash storage (UFS) according to some example embodiments.

FIG. 27 is a block diagram illustrating a universal flash storage (UFS) according to some example embodiments.

Referring to FIG. 27, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by the nonvolatile memory device 10 of FIG. 1. Therefore, least one of the UFS devices 3200 and 3300, the embedded UFS device 3400, and the removable UFS card 3500 may prevent degradation of the endurance characteristics of the memory cells in spite of the increase of the number of the program/erase cycles on the memory cells.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Figure 28:
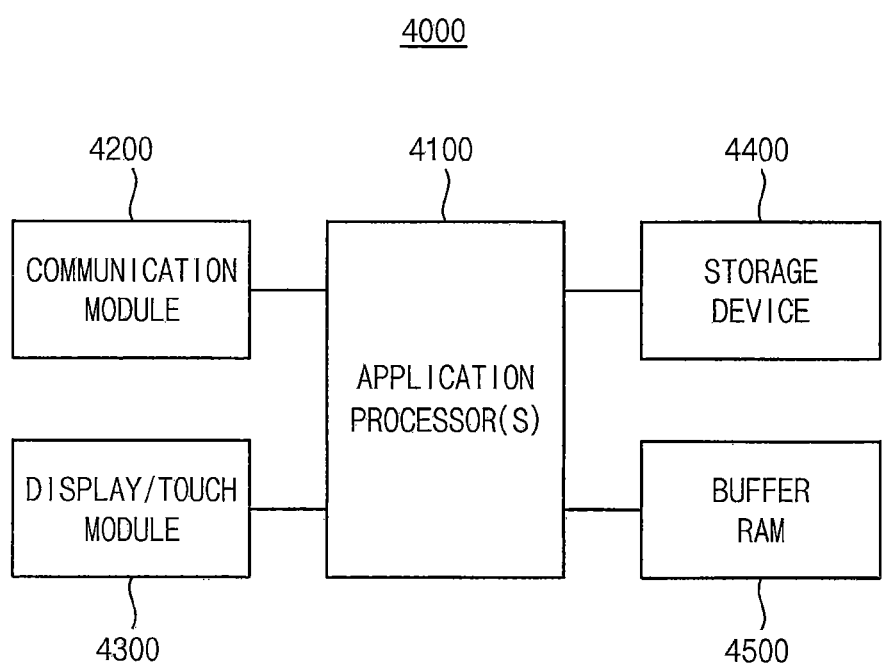
FIG. 28 is a block diagram illustrating a mobile device according to some example embodiments.

FIG. 28 is a block diagram illustrating a mobile device according to some example embodiments.

Referring to FIG. 28, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be eMMC, SSD, UFS device, etc. The storage device 4400 may include the nonvolatile memory device of FIG. 1. The storage device 4400 may prevent degradation of the endurance characteristics of the memory cells in spite of the increase of the number of the program/erase cycles on the memory cells.

The mobile RAM 4500 temporarily stores data used for processing operations of the mobile device 4000.

It may be beneficial to implement a small-sized mobile device 4000 by improving the degree of freedom on lines to improve a layout.

A memory device or a storage device according to an embodiment of the inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

The present disclosure may be applied to various devices and systems. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of some example embodiments and is not to be construed as limiting thereof. Although a few example embodiments have been described, those skilled in the art will readily appreciate that many modifications are possible without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a nonvolatile memory device, the method comprising:
performing erase loops on a memory block using a first voltage;
performing program loops on memory cells of the memory block using a second voltage; and
increasing the first and second voltages based on program/erase cycle information for the memory cells, wherein each of the program loops comprises:
programming respective ones of the memory cells connected to a word-line to an erased state or a plurality of programmed states by applying a program voltage to the word-line; and
performing a program verification on the ones of the memory cells by applying a program verification voltage to the word-line,
wherein the second voltage comprises the program voltage and the program verification voltage,
wherein increasing the first and second voltages comprises increasing the program voltage and the program verification voltage based on the program/erase cycle information such that a gap between a first threshold voltage distribution of the erased state and a second threshold voltage distribution of one of the programmed states is maintained,
wherein the program/erase cycle information comprises a number of program/erase cycles performed on the memory cells, and
wherein the program voltage and the program verification voltage are increased as the number of program/erase cycles increases such that the gap between the first threshold voltage distribution of the erased state and the second threshold voltage distribution of the one of the programmed states is equal before and after the program voltage and the program verification voltage are increased.

2. The method of claim 1, wherein each of the erase loops comprises:
performing an erase operation on the memory block by applying an erase voltage to the memory block; and
performing an erase verification operation on the memory block by applying an erase verification voltage to the memory block,
wherein the first voltage comprises the erase verification voltage.

3. The method of claim 2, wherein the erase verification voltage is increased as the number of program/erase cycles increases.

4. The method of claim 2, wherein the erase verification operation comprises simultaneously applying the erase verification voltage to word-lines of the memory block.

5. The method of claim 2, wherein the erase verification operation comprises sequentially applying the erase verification voltage to word-lines of the memory block.

6. A method of operating a nonvolatile memory device, the method comprising:
performing erase loops on a memory block using an erase verification voltage;
performing program loops on memory cells of the memory block using a program voltage; and
increasing the erase verification voltage used in the erase loops as a number of program/erase cycles increases; and
increasing the program voltage used in the program loops as the erase verification voltage increases to maintain a gap between a threshold voltage of an erased state and a threshold voltage of a programmed state,
wherein each of the program loops comprise:
programming respective ones of the memory cells connected to a word-line to the erased state or a plurality of programmed states by applying the program voltage to the word-line; and
performing a program verification on the ones of the memory cells by applying a program verification voltage to the word-line,
wherein the method further comprises increasing the program verification voltage when the program voltage increases, and
wherein the program voltage and the program verification voltage are increased as the number of program/erase cycles increases such that a gap between a first threshold voltage distribution of the erased state and a second threshold voltage distribution of the programmed state is equal before and after the program voltage and the program verification voltage are increased.

7. The method of claim 6, further comprising changing a pass voltage applied to a non-selected word-line as the program voltage changes.

\* \* \* \* \*